(12) United States Patent
Wang et al.

(10) Patent No.: US 12,166,045 B2
(45) Date of Patent: Dec. 10, 2024

(54) DISPLAY SUBSTRATE AND DISPLAY APPARATUS

(71) Applicants: Beijing BOE Optoelectronics Technology Co., Ltd., Beijing (CN); BOE TECHNOLOGY GROUP CO., LTD., Beijing (CN)

(72) Inventors: Xian Wang, Beijing (CN); Yu Zhao, Beijing (CN); Xiaojuan Wu, Beijing (CN); Chunnan Feng, Beijing (CN); Jian Wang, Beijing (CN); Yong Zhang, Beijing (CN); Dawei Feng, Beijing (CN); Huairui Yue, Beijing (CN); Yang Ge, Beijing (CN); Jianwei Ma, Beijing (CN); Lei Shi, Beijing (CN); Biqi Li, Beijing (CN); Feng Qu, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,096

(22) PCT Filed: Jun. 24, 2021

(86) PCT No.: PCT/CN2021/102063
§ 371 (c)(1),
(2) Date: May 19, 2022

(87) PCT Pub. No.: WO2022/266929
PCT Pub. Date: Dec. 29, 2022

(65) Prior Publication Data
US 2024/0170495 A1    May 23, 2024

(51) Int. Cl.
*G02F 1/1362* (2006.01)
*H01L 27/12* (2006.01)

(52) U.S. Cl.
CPC ...... *H01L 27/124* (2013.01); *G02F 1/136286* (2013.01)

(58) Field of Classification Search
CPC ........................................ G02F 1/1362
See application file for complete search history.

(56) References Cited

U.S. PATENT DOCUMENTS

2019/0067403 A1\* 2/2019 Song .................. H01L 29/78633
2020/0258946 A1\* 8/2020 Kim ..................... H10K 50/115
(Continued)

FOREIGN PATENT DOCUMENTS

CN    102749770 A    10/2012
CN    102749771 A    10/2012
(Continued)

*Primary Examiner* — Sang V Nguyen
(74) *Attorney, Agent, or Firm* — HOUTTEMAN LAW LLC

(57) ABSTRACT

A display substrate has a display area and a peripheral area surrounding the display area; the display area has a functional area and a non-functional area; the display substrate includes a base substrate, a plurality of first signal lines, a first interlayer insulating layer, a plurality of second signal lines, a conductive mesh and an auxiliary functional structure; the conductive mesh includes a plurality of first conductive structures and a plurality of second conductive structures which are arranged crosswise and electrically connected to each other; the auxiliary functional structure includes a plurality of first conductive wires and a plurality of second conductive wires which are arranged crosswise; the first conductive wire is at least a part of the first conductive structure, and each of some first conductive structures includes two first conductive wires; the second (Continued)

conductive wire is at least a part of the second conductive structure.

16 Claims, 15 Drawing Sheets

(56) References Cited

U.S. PATENT DOCUMENTS

| | | | | |
|---|---|---|---|---|
| 2021/0240044 A1* | 8/2021 | Bi | ................... | G02F 1/136222 |
| 2023/0157093 A1* | 5/2023 | Ye | ......................... | H01Q 1/38 |
| | | | | 257/40 |
| 2023/0253697 A1* | 8/2023 | Wang | ..................... | H01Q 7/00 |
| | | | | 257/72 |

FOREIGN PATENT DOCUMENTS

| | | | | |
|---|---|---|---|---|
| CN | 108319392 | A | 7/2018 | |
| CN | 110633031 | A | 12/2019 | |
| CN | 111258459 | A | 6/2020 | |
| CN | 111430443 | A | 7/2020 | |
| CN | 111508340 | A | 8/2020 | |
| CN | 112462560 | A | 3/2021 | |
| CN | 113917744 | * | 1/2022 | ........... G02F 1/1368 |
| CN | 111258459 | * | 10/2022 | ............. G06F 3/041 |

* cited by examiner

DISPLAY SUBSTRATE AND DISPLAY APPARATUS

TECHNICAL FIELD

The present disclosure belongs to the field of display technology, and in particular relates to a display substrate and a display apparatus.

BACKGROUND

Near Field Communication (NFC) technology is a non-contact identification and interconnection technology. It adopts a near magnetic field communication method, and has characteristics of short transmission distance, low energy consumption, signal being not easily interfered and the like, and may perform a short-distance lineless communication between a mobile device and consumer electronics.

The near field communication technology has been widely applied to an electronic device for data exchange. To use the NFC technology, it is necessary to install a communication antenna on the electronic device to receive and transmit electromagnetic wave signals, and the communication antenna needs to occupy a large space. In most of existing electronic devices using the NFC technology, a separate NFC communication module is externally placed on a mainboard of the electronic device. Consequently, it needs to occupy a large space, which is unfavorable for a thin and light design of the electronic device.

SUMMARY

The present disclosure is directed to at least one of the technical problems of the prior art, and provides a display substrate and a display apparatus.

In a first aspect, an embodiment of the present disclosure provide a display substrate, including a display area and a peripheral area surrounding the display area; wherein the display area includes a functional area and a non-functional area; and the display substrate includes:
  a base substrate;
  a plurality of first signal lines, which are on the base substrate and in the display area and the peripheral area, extend in a first direction and are arranged side by side in a second direction;
  a first interlayer insulating layer, which is on a side of the plurality of first signal lines away from the base substrate;
  a plurality of second signal lines, which are on a side of the first interlayer insulating layer away from the base substrate and in the display area and the peripheral area, extend in the second direction and are arranged side by side in the first direction;
  a conductive mesh, which is on the base substrate; wherein the conductive mesh includes a plurality of first conductive structures and a plurality of second conductive structures, each of the plurality of first conductive structures intersects with and is electrically connected to plurality of second conductive structures, and each of the plurality of second conductive structures intersects with and is electrically connected to plurality of first conductive structures; the plurality of first conductive structures and the plurality of second conductive structures are in the display area and the peripheral area; an orthographic projection of each of the plurality of first conductive structures on the base substrate at least partially overlaps an orthographic projection of one of the plurality of first signal lines on the base substrate; an orthographic projection of each of the plurality of second conductive structures on the base substrate at least partially overlaps an orthographic projection of one of the plurality of second signal lines on the base substrate; and
  an auxiliary functional structure, which is on the base substrate and in at least the display area; wherein the auxiliary functional structure includes a plurality of first conductive wires and a plurality of second conductive wires which are arranged crosswise; each of the plurality of first conductive wires is at least a part of one of the plurality of first conductive structures, and each of at least a portion of the plurality of first conductive structures includes two of the plurality of first conductive wires; and each of the plurality of second conductive wires is at least a part of one of the plurality of second conductive structures.

The display substrate further includes a plurality of sub-pixels; the sub-pixels arranged side by side in the first direction form a first pixel group, and the second sub-pixels arranged side by side in the second direction form a second pixel group;
  each of the plurality of first conductive structures is between two adjacent first pixel groups; and each of the plurality of second conductive structures is between two adjacent second pixel groups.

Each of the plurality of first signal lines is a gate line, each of the plurality of second signal lines is a data line; the sub-pixels in a same first pixel group are controlled by a same gate line, and the sub-pixels in a same second pixel group are written with data voltage signals by a same data line.

The display substrate further includes a plurality of sub-pixels; the sub-pixels arranged side by side in the first direction form a first pixel group, and the second sub-pixels arranged side by side in the second direction form a second pixel group; the sub-pixels in a same second pixel group have a same color, and every N number of sub-pixels arranged side by side in the first direction form a pixel unit, where N≥2, and N is an integer; the pixel units arranged side by side in the second direction form a pixel unit group; and every two adjacent first pixel groups is provided with one of the plurality of first conductive structures therebetween; and in each pixel unit group is arranged one of the plurality of second conductive structures.

The N number of sub-pixels in the pixel unit include a red sub-pixel, a green sub-pixel and a blue sub-pixel; and each of the plurality of second conductive structures is between the red sub-pixel and the green sub-pixel.

Each of the plurality of first signal lines is a gate line, and each of the plurality of second signal lines is a touch signal line.

The display substrate further includes a plurality of data lines; the sub-pixels in a same first pixel group are controlled by a same gate line, and the sub-pixels in a same second pixel group are written with data voltage signals by a same data line.

Each of the plurality of sub-pixels includes a thin film transistor, a pixel electrode and a common electrode; gate electrodes of the thin film transistors in the same first pixel group are connected to the same gate line; source electrodes of the thin film transistors in the same second pixel group are connected to the same data line; a drain electrode of the thin film transistor in any sub-pixel is directly connected to the pixel electrode;

the conductive mesh is on a side of the thin film transistor close to the base substrate, and a second interlayer insulating layer is between the conductive mesh and a layer where the gate electrode of the thin film transistor is located; and a third interlayer insulating layer is on a side of a layer, where the pixel electrode is located, away from the base substrate, and the common electrode is on a side of the third interlayer insulating layer away from the base substrate.

The auxiliary functional structure has a first end and a second end; the second conductive wires in the first end and the second end of the auxiliary functional structure extend into the peripheral area; the display substrate further includes a first shorting bar, a second shorting bar, a first transfer electrode, a second transfer electrode, a first connecting electrode and a second connecting electrode which are in the peripheral area;

the first shorting bar and the second shorting bar are in a same layer as the auxiliary functional structure; the first shorting bar is configured to short the second conductive wires in the first end of the auxiliary functional structure; the second shorting bar is configured to short the second conductive wires in the second end of the auxiliary functional structure;

the first transfer electrode and the second transfer electrode are in a same layer as the gate line, the first transfer electrode is electrically connected to the first shorting bar through a via penetrating through the second interlayer insulating layer, and the second transfer electrode is electrically connected to the second shorting bar through a via penetrating through the second interlayer insulating layer; and the first connecting electrode and the second connecting electrode are in a same layer as the common electrode, the first connecting electrode is electrically connected to the first transfer electrode through a via penetrating through the first interlayer insulating layer and the third interlayer insulating layer, and the second connecting electrode is electrically connected to the second transfer electrode through a via penetrating through the first interlayer insulating layer and the third interlayer insulating layer.

The auxiliary functional structure has a first end and a second end; the second conductive wires in the first end and the second end of the auxiliary functional structure extend into the peripheral area; the display substrate further includes a plurality of first shorting bars, a plurality of second shorting bars, a plurality of first transfer electrodes, a plurality of second transfer electrodes, a plurality of first connecting electrodes and a plurality of second connecting electrodes which are in the peripheral area;

the plurality of first shorting bars and the plurality of second shorting bars are in a same layer as the auxiliary functional structure; each of the plurality of first shorting bars is configured to short the second conductive wires which are arranged adjacently in the first end of the auxiliary functional structure; each of the plurality of second shorting bars is configured to short the second conductive wires which are arranged adjacently in the second end of the auxiliary functional structure;

the plurality of first transfer electrodes and the plurality of second transfer electrodes are in a same layer as the gate line, each of the plurality of first transfer electrodes is electrically connected to one of the plurality of first shorting bars through a via penetrating through the second interlayer insulating layer, and each of the plurality of second transfer electrodes is electrically connected to one of the plurality of second shorting bars through a via penetrating through the second interlayer insulating layer; and the plurality of first connecting electrodes and the plurality of second connecting electrodes are in a same layer as the common electrode, each of the plurality of first connecting electrodes is electrically connected to one of the plurality of first transfer electrodes through a via penetrating through the first interlayer insulating layer and the third interlayer insulating layer, and each of the plurality of second connecting electrodes is electrically connected to one of the plurality of second transfer electrodes through a via penetrating through the first interlayer insulating layer and the third interlayer insulating layer.

Each of the plurality of sub-pixels includes a thin film transistor, a pixel electrode, and a common electrode; gate electrodes of the thin film transistors in the same first pixel group are connected to the same gate line; source electrodes of the thin film transistors in the same second pixel group are connected to the same data line; a second interlayer insulating layer is on a layer where the source electrode and drain electrode of the thin film transistor are arranged; the drain electrode of the thin film transistor in any sub-pixel is electrically connected to the pixel electrode through a via penetrating through the second interlayer insulating layer;

the conductive mesh is on one side of the second interlayer insulating layer away from the base substrate; and a third interlayer insulating layer is on a side of a layer, where the pixel electrode is located, away from the base substrate, and the common electrode is on a side of the third interlayer insulating layer away from the base substrate.

The auxiliary functional structure has a first end and a second end; the second conductive wires in the first end and the second end of the auxiliary functional structure extend into the peripheral area; the display substrate further includes a first shorting bar, a second shorting bar, a first connecting electrode and a second connecting electrode which are in the peripheral area;

the first shorting bar and the second shorting bar are in a same layer as the auxiliary functional structure; the first shorting bar is configured to short the second conductive wires in the first end of the auxiliary functional structure; the second shorting bar is configured to short the second conductive wires in the second end of the auxiliary functional structure;

the first connecting electrode and the second connecting electrode are in a same layer as the common electrode, the first connecting electrode is electrically connected to the first shorting bar through a via penetrating through the third interlayer insulating layer, and the second connecting electrode is electrically connected to the second shorting bar through a via penetrating through the third interlayer insulating layer.

The auxiliary functional structure has a first end and a second end; the second conductive wires in the first end and the second end of the auxiliary functional structure extend into the peripheral area; the display substrate further includes a plurality of first shorting bars, a plurality of second shorting bars, a plurality of first connecting electrodes and a plurality of second connecting electrodes which are in the peripheral area;

the plurality of first shorting bars and the plurality of second shorting bars are in a same layer as the auxiliary functional structure; each of the plurality of first shorting bars is configured to short the second conductive wires which are arranged adjacently in the first end of the auxiliary functional structure; each of the plurality of second shorting bars is configured to short the second conductive wires which are arranged adjacently in the second end of the auxiliary functional structure; and the plurality of first connecting electrodes and the plurality of second connecting electrodes are in a same layer as the common electrode, each of the plurality of first connecting electrodes is electrically connected to one of the plurality of first shorting bars through a via penetrating through the third interlayer insulating layer, and each of the plurality of second connecting electrodes is electrically connected to one of the plurality of second shorting bars through a via penetrating through the third interlayer insulating layer.

Any of the plurality of first conductive structures has a plurality of first openings, and an orthographic projection of each of the plurality of the first openings on the base substrate covers an orthographic projection of an active layer of the thin film transistor of one of the plurality of sub-pixels on the base substrate.

The display area includes at least one first area and at least one second area; the auxiliary functional structure is in one of the at least one first area;

the display substrate further includes:

a plurality of third conductive wires and a plurality of fourth conductive wires, which are on the base substrate and in the second area and the peripheral area; wherein each of the plurality of third conductive wires intersects with the plurality of fourth conductive wires, each of the plurality of fourth conductive wires intersect with the plurality of third conductive wires, each of the plurality of third conductive wires is at least a part of one of the plurality of first conductive structures; each of the plurality of fourth conductive wires is a part of one of the plurality of second conductive structures; and a distance between the fourth conductive wire and the second conductive wire in one of the plurality of second conductive structures is in a range of 2 μm to 6 μm.

The display substrate further includes:

a signal lead-in line, which is on the base substrate and in the peripheral area; each of the plurality of third conductive wires is electrically connected to the signal lead-in line; and/or each of the plurality of fourth conductive wires is electrically connected to the signal lead-in line.

The auxiliary functional structure includes at least one coil portion; each of the at least one coil portion at least includes two sub-structures having different extending directions; each of the two sub-structures includes a portion of the plurality of first conductive wires and a portion of the plurality of second conductive wires.

Each of the at least one the coil portion includes three sub-structures, which are two first sub-structures and one second sub-structure; the two first sub-structures extend in the second direction and are arranged side by side in the first direction, and the second sub-structure is between the two first sub-structures and connected to the two first sub-structures.

The display area includes at least one first area and at least one second area; a third conductive structure is in the first area; the first area includes a non-functional area and a functional area surrounding the non-functional area; the coil portion is in the functional area;

the display substrate further includes a plurality of fifth conductive wires and a plurality of sixth conductive wires which are in the non-functional area, wherein each of the plurality of fifth conductive wires intersects with the plurality of sixth conductive wires, each of the plurality of sixth conductive wires intersect with the plurality of fifth conductive wires; the first conductive structure includes the fifth conductive wire; the second conductive structure includes the sixth conductive wire; a distance between the fifth conductive wire and the first conductive wire in a same first conductive structure is in a range of 2 μm to 6 μm; and/or a distance between the sixth conductive wire and the second conductive wire in a same second conductive structure is a range of 2 μm to 6 μm.

The fifth conductive wire includes a plurality of first conductive sub-wires arranged side by side and at intervals in the first direction; and a gap between the first conductive sub-wires which are adjacent to each other is between the sub-pixels which are adjacent to each other.

A width of the gap between the first conductive sub-wires which are adjacent to each other is in a range of 2 μm to 6 μm.

The display substrate further includes:

a signal lead-in line which is on the base substrate and in the peripheral area; the signal lead-in line is electrically connected to the first sub-common electrode line through a via.

The display area includes at least one first area and at least one second area; the auxiliary functional structure is in one of the at least one first area; the first area includes a non-functional area and a functional area surrounding the non-functional area; the functional area include: a plurality of functional sub-areas, wherein an inner functional sub-area of the plurality of functional sub-areas is nested in an outer functional sub-area of the plurality of functional sub-areas; and a redundant functional area which is between two adjacent sub-functional areas; in each of the plurality of functional sub-areas is arranged one of the at least one coil portion;

the display substrate further includes a redundant coil portion arranged on the base substrate and in the redundant functional area; and the redundant coil portion includes a plurality of seventh conductive wires and a plurality of eighth conductive wires, which are arranged crosswise and are in the redundant functional area; each of the plurality of seventh conductive wires is a part of one of the plurality of first conductive structures, and each of the plurality of eighth conductive wires is a part of one of the plurality of second conductive structures.

A distance between the first conductive wire and the seventh conductive wire nearest to this first conductive wire in a same first conductive structure is in a range of 2 μm to 6 μm; and/or a distance between the eighth conductive wire and the second conductive wire nearest to this eighth conductive wire in a same second conductive structure is in a range of 2 μm to 6 μm.

The redundant coil portion includes two first redundant sub-structures arranged side by side in the first direction and extending in the second direction, and one second redundant sub-structure extending in the first direction and between and connected to the two first redundant sub-structures; the two first redundant sub-structures and the second redundant sub-structure each include a portion of the plurality of seventh conductive wires and a portion of the plurality of eighth conductive wires; the eighth conductive wire in the first redundant structure extends into an area where the second redundant sub-structure is located; the seventh conductive wire in the second redundant structure extends into an area where the first redundant sub-structure is located;

the seventh conductive wire in the first redundant sub-structure includes a plurality of second conductive sub-wires arranged side by side in the first direction; and a gap between the second conductive sub-wires which are adjacent to each other is between the sub-pixels which are adjacent to each other; and/or the eighth conductive wire in the second redundant sub-structure includes a plurality of third conductive sub-wires arranged side by side in the second direction; and a gap between the third conductive sub-wires which are adjacent to each other is between the sub-pixels which are adjacent to each other.

A width of the gap between the second conductive sub-wires which are adjacent to each other is in a range of 2 μm to 6 μm; and/or, a width of the gap between the third conductive sub-wires which are adjacent to each other is in a range of 2 μm to 6 μm.

The display substrate further includes:

a signal lead-in line which is on the base substrate and in the peripheral area; each of the plurality of eighth conductive wires in the first redundant sub-structure is electrically connected to the signal lead-in line; and/or, each of the plurality of seventh conductive wires in the second redundant sub-structure is electrically connected to the signal lead-in line.

The display substrate further includes a connecting jumper on the base substrate, wherein the connecting jumper is connected to the coil portions to form a spiral coil.

The display substrate further includes a flexible circuit board on which a connecting jumper is disposed, wherein the connecting jumper is connected to the coil portions to form a spiral coil.

The third conductive structure includes a near field communication antenna.

In a second aspect, an embodiment of the present disclosure provides a display apparatus, which includes any one of the display substrates described above.

The display apparatus further includes an opposing substrate which is opposite to the display substrate, a black matrix is on the opposing substrate, and an orthographic projection of the third conductive structure on the base substrate is within an orthographic projection of the black matrix on the base substrate.

BRIEF DESCRIPTION OF DRAWINGS

FIG. 8a is another cross-sectional view taken along E-E' in FIG. 7a.

DETAIL DESCRIPTION OF EMBODIMENTS

In order to enable one of ordinary skill in the art to better understand the technical solution of the present disclosure, the present disclosure will be further described in detail with reference to the accompanying drawings and the detailed description below.

Unless otherwise defined, a technical or scientific term used herein shall have the ordinary meaning as understood by one of ordinary skill in the art to which the present disclosure belongs. The terms "first", "second", and the like, as used in the present disclosure, do not denote any order, quantity, or importance, but rather are used to distinguish one element from another. Similarly, the term "a", "an", "the" or the like does not denote a limitation of quantity, but rather denotes the presence of at least one. The term "comprising", "comprises", or the like, means that the element or item appearing in front of the word "comprising" or "comprises" includes the element or item listed after the word "comprising" or "comprises" and its equivalents, and does not exclude other elements or items. The term "connected", "coupled" or the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

It should be noted that an embodiment of the present disclosure provides a display substrate and a display apparatus. The display apparatus may be a Liquid Crystal Display (LCD) apparatus or an Organic Light-Emitting Diode (OLED) display apparatus. Alternatively, other types of display apparatuses are also possible, which are not listed herein. In the embodiments of the present disclosure, a liquid crystal display apparatus is described as an example of the display apparatus. The liquid crystal display apparatus includes a display substrate and an opposing substrate which are opposite to each other, and a liquid crystal layer arranged between the display substrate and the opposing substrate. The display substrate may be an array substrate, or a COA (Color On Array) substrate. Where the display substrate is an array substrate, the opposing substrate includes a color filter layer; where the display substrate is a COA substrate, the color filter layer is not necessary in the opposing substrate. In the embodiments of the present disclosure, an array substrate is taken as an example of the display substrate.

Figure 1:
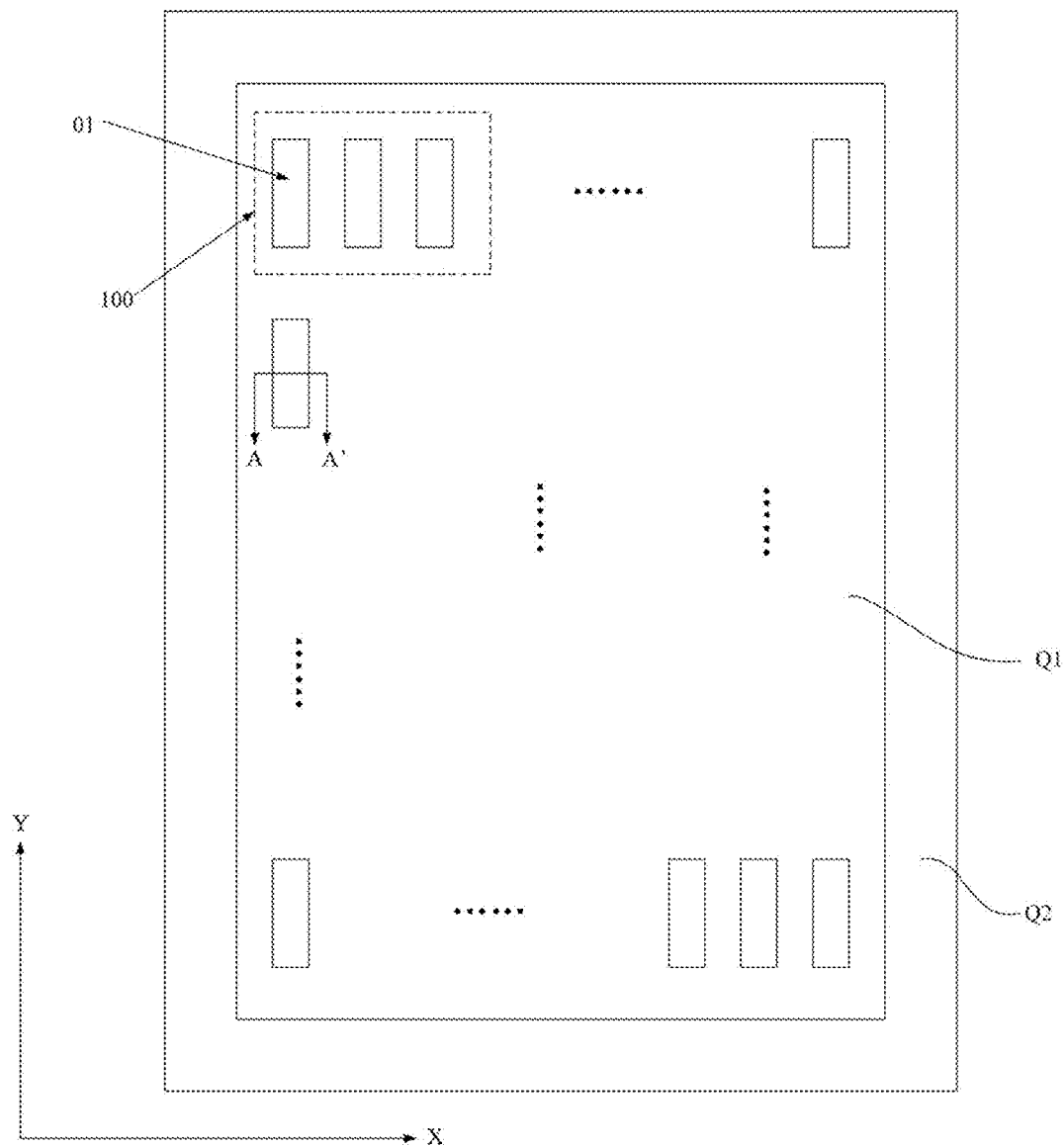
FIG. 1 is a schematic diagram of an exemplary display substrate.
Figure 2:
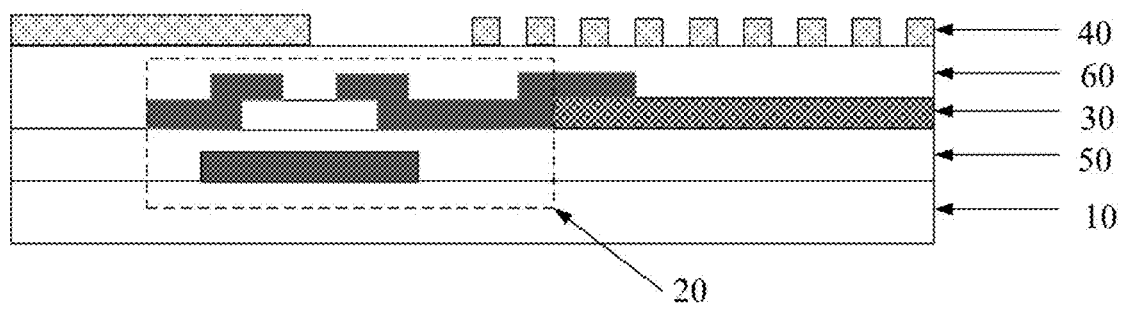
FIG. 2 is a cross-sectional view taken along A-A' of the display substrate shown in FIG. 1.

FIG. 1 is a schematic diagram of an exemplary display substrate. As shown in FIG. 1, the display substrate has a display area Q1 and a peripheral area Q2 surrounding the display area Q1; and the peripheral area Q2 includes a first pad area Q21 at a side of the display area Q1. The display substrate includes a base substrate 10, a plurality of gate lines GL and a plurality of data lines DL arranged on the base substrate 10, and a plurality of sub-pixels defined by the gate lines GL and the data lines DL which cross each other. The gate lines GL extend in a first direction X and are arranged side by side in a second direction Y; the data lines DL extend in the second direction Y and are arranged side by side in the first direction X; a plurality of sub-pixels 01 arranged side by side in a first direction X form a first pixel group; a plurality of sub-pixels 01 arranged side by side in the second direction Y form a second pixel group. Each sub-pixel at least includes a thin film transistor 20, a pixel electrode 30, and a common electrode 40. Gate electrodes of the thin film transistors 20 in the sub-pixels 01 in a same first pixel group are connected to a same gate line GL; source electrodes of the thin film transistors 20 in the sub-pixels in a same second pixel group are connected to a same data line DL. FIG. 2 is a cross-sectional view taken along A-A' of the display substrate shown in FIG. 1. As shown in FIG. 2, the thin film transistor 20 in the sub-pixel 01 includes a gate electrode, an active layer, a source electrode, and a drain electrode sequentially arranged in a direction away from the base substrate 10. The drain electrode of the thin film transistor 20 is connected to the pixel electrode 30. A first interlayer insulating layer 50 (serving as a gate insulating layer) is arranged between the gate electrode and the active layer, and the pixel electrode 30 is located on a side of the first interlayer insulating layer 50 away from the base substrate 10; a third interlayer insulating layer 60 covers the source and drain electrodes of the thin film transistor 20 and the pixel electrode 30, on a side of the source and drain electrodes of the thin film transistor 20 and the pixel electrode 30 away from the base substrate 10, and the common electrode 40 is formed on a side of the third interlayer insulating layer 60 away from the base substrate 10. The pixel electrode 30 is a plate electrode, and the common electrode 40 is a slit electrode.

It should be noted that in the embodiments of the present disclosure, the first direction X and the second direction Y each do not refer to a direction extending straight, but refer to an extending direction of a structure or a length direction of the structure. The thin film transistor 20 in FIG. 2 is only described by taking an example of a bottom gate thin film transistor 20, which does not limit the protection scope of the embodiment of the present disclosure. The thin film transistor 20 may alternatively be a top gate thin film transistor 20. In addition, in an embodiment of the present disclosure, each of the sub-pixels 01 includes the pixel electrode 30 and the common electrode 40. In some examples, the common electrode 40 may alternatively be arranged on a color filter substrate, for example, in a TN mode display apparatus, and therefore the presence of the common electrode 40 on the display substrate does not limit the protection scope of the embodiment of the present disclosure. In an embodiment of the present disclosure, as an example, the pixel electrode 30 and the common electrode 40 are both arranged on the display substrate.

In addition, the display substrate includes a plurality of pixel units 100 arranged in an array, each pixel unit 100 includes N number of sub-pixels, where and N is an integer. In an embodiment of the present disclosure, three sub-pixels are included in one pixel unit, that is, N=3 is taken as an example. For example, each pixel unit includes a red sub-pixel, a green sub-pixel, and a blue sub-pixel. In this case, the sub-pixels in a same column may emit light of a same color.

For the above described display substrate, in an embodiment of the present disclosure, an auxiliary functional structure is integrated in the display substrate to implement additional functions besides display, such as a signal transceiving function, and the like. In the following description, a coil portion of a near field communication antenna is taken as an example of the auxiliary functional structure, but it should be understood that this does not limit the protection scope of the embodiments of the present disclosure.

Figure 3:
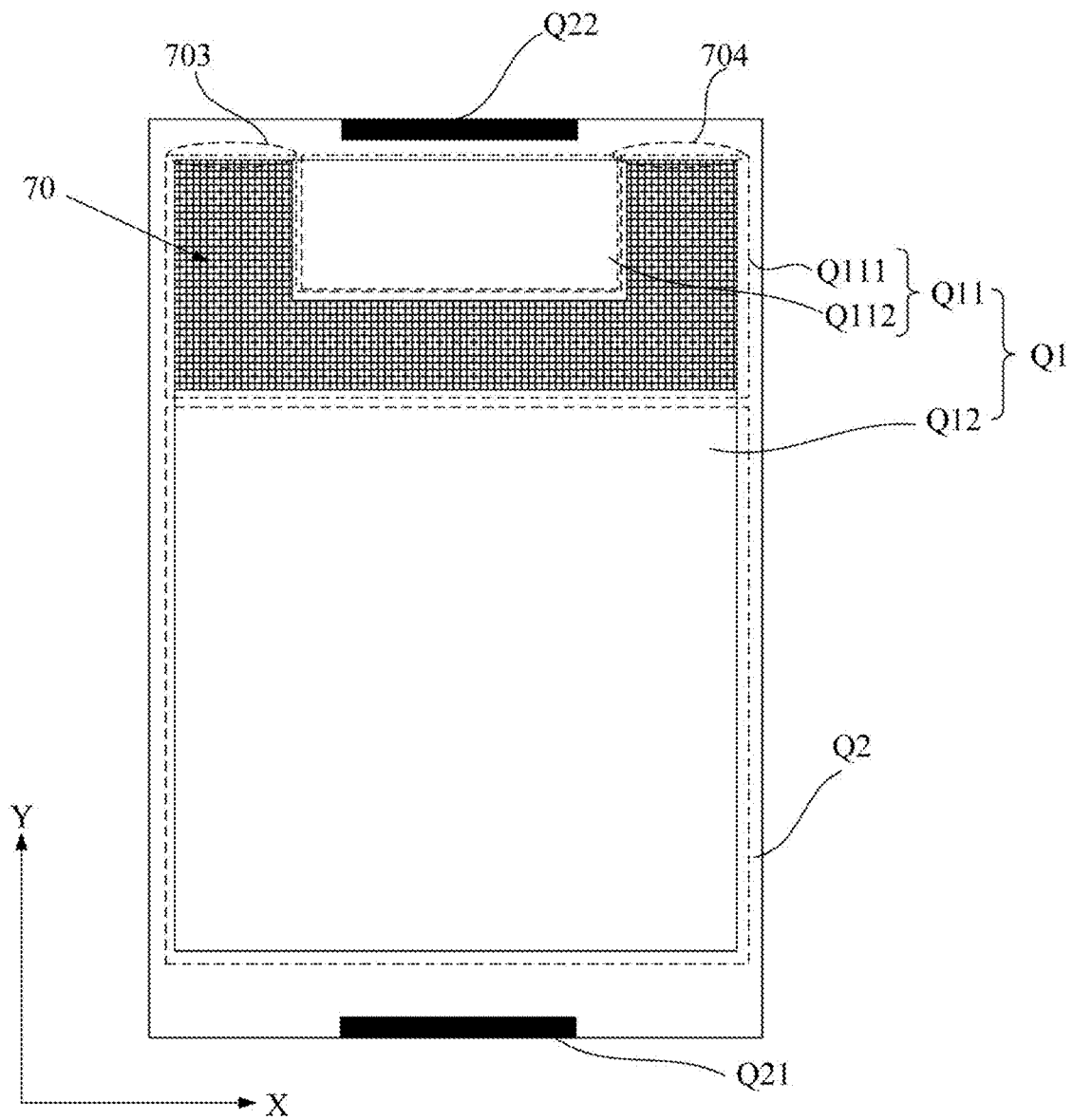
FIG. 3 is a schematic diagram of a display substrate according to an embodiment of the present disclosure.
Figure 4:
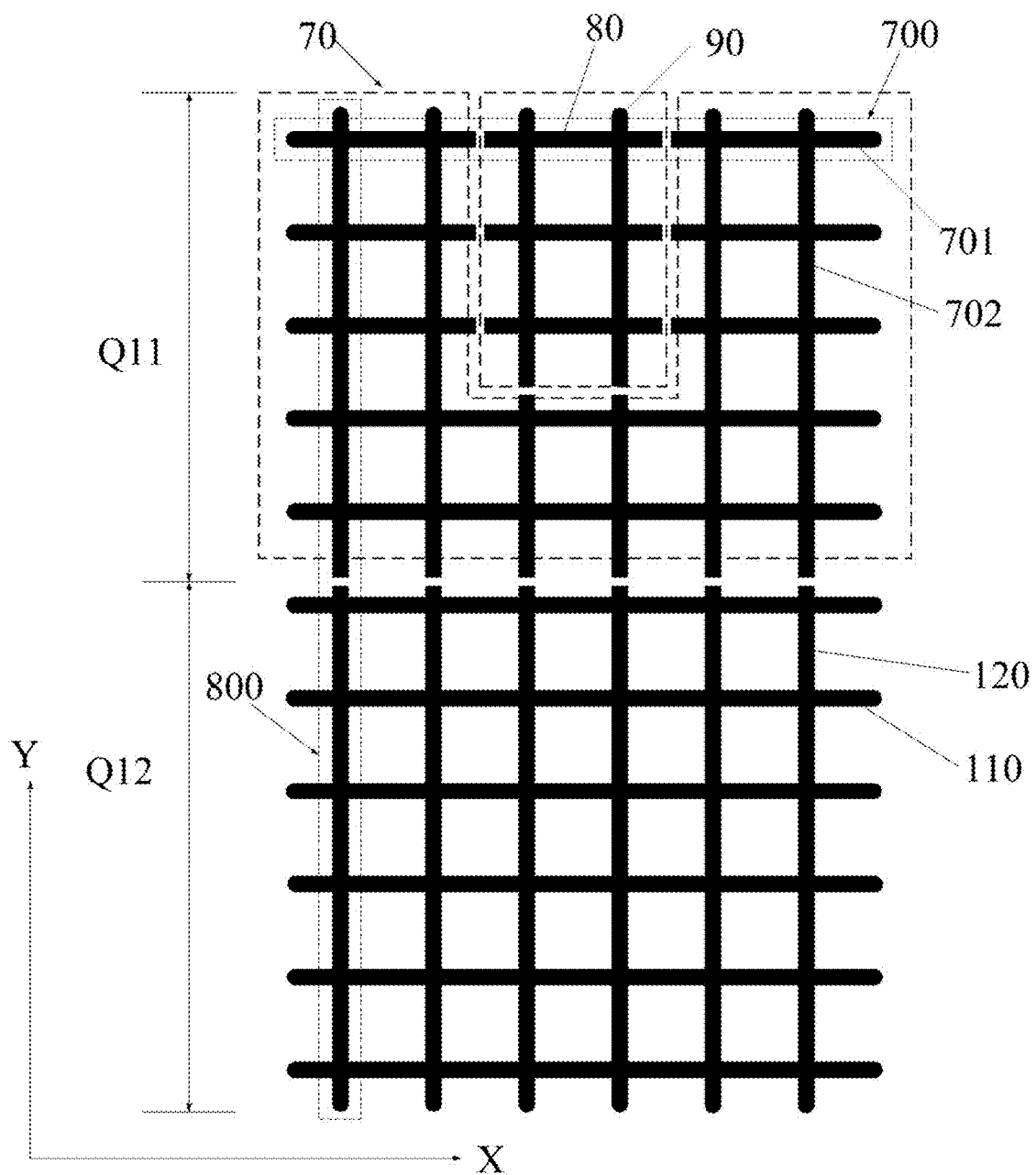
FIG. 4 is a schematic diagram of a conductive mesh in a display substrate according to an embodiment of the present disclosure.

FIG. 3 is a schematic diagram of a display substrate according to an embodiment of the present disclosure. FIG. 4 is a schematic diagram of a conductive mesh in a display substrate according to an embodiment of the present disclosure. In a first aspect, as shown in FIGS. 3 and 4, the present disclosure provides a display substrate having a display area Q1 and a peripheral area Q2 surrounding the display area Q1; the display substrate includes a base substrate 10, a plurality of first signal lines, a first interlayer insulating layer 50, a plurality of second signal lines, a conductive mesh, and a coil portion 70 of a near field communication antenna. Each of the first signal lines is arranged on the base substrate 10 and located in the display area Q1 and the peripheral area Q2. Each of the first signal lines extends in the first direction X, and the first signal lines are arranged side by side in the second direction Y. The first interlayer insulating layer 50 is arranged on a side of a layer, where the first signal lines are located, away from the base substrate 10, and the second signal lines are arranged on a side of the first interlayer insulating layer 50 away from the base substrate 10. Each of the second signal lines extends in the second direction Y, and the second signal lines are arranged side by side in the first direction X. The conductive mesh is arranged on the base substrate 10; the conductive mesh includes a plurality of first conductive structures 700 and a plurality of second conductive structures 800, each of the plurality of first conductive structures intersects with and is electrically connected to plurality of second conductive structures, and each of the plurality of second conductive structures intersects with and is electrically connected to plurality of first conductive structures; an orthographic projection of each first conductive structure 700 on the base substrate 10 at least partially overlaps an orthographic projection of one first signal line on the base substrate 10, and an orthographic projection of each second conductive structure 800 on the base substrate 10 at least partially overlaps an orthographic projection of one second signal line on the base substrate 10. The coil portion 70 of the near field communication antenna is arranged on the base substrate 10, and is located at least in the display area Q1; the near field communication antenna may include at least one coil portion 70, each of the at least one coil portion 70 includes a plurality of first conductive wires 701 and a plurality of second conductive wires 702 arranged crosswise; the first conductive wire 701 is at least a part of the first conductive structure 700, and each of a portion of the first conductive structures 700 includes two first conductive wires 701; the second conductive wire 702 is at least a part of the second conductive structure 800.

It should be noted that the peripheral area Q2 of the display substrate according to an embodiment of the present disclosure has a first pad area Q21 and a second pad area Q22 which are oppositely arranged in the second direction Y. The coil portion(s) 70 of the near field communication antenna may be arranged at a side of the display area Q1 close to the first pad area Q21 and/or the second pad area Q22, to facilitate bonding of end(s) of the coil portion(s) 70 with a driving chip (IC) or a flexible circuit board. In FIG. 3, as an example, the coil portion 70 is only arranged at a side of the display area Q1 close to the second pad area Q22, which is not intended to limit the protection scope of the embodiment of the present disclosure. In an embodiment of the present disclosure, in order to form a bending pattern to form the coil portion 70, two first conductive wires 701 are included in each of a portion of the first conductive structures 700. Where the near field communication antenna includes only one coil portion 70, both ends of the coil portion 70 are connected to a control circuit to form a closed loop. In this case, an external magnetic induction coil may form an induced current loop in the near field communication antenna and the control circuit, thereby achieving the near field communication. Where there are a plurality of coil portions 70, the plurality of coil portions 70 may be connected to each other by a connecting jumper 130 to form an antenna coil, both ends of the near field communication antenna are connected to the control circuit to form a closed loop, and an induced current loop may be formed in the near field communication antenna and the control circuit by an external magnetic induction coil, to achieve the near field communication. A specific structure will be described in the following specific examples.

In an embodiment of the present disclosure, since the coil portion 70 of the near field communication antenna is integrated in the display area Q1, space saving is facilitated, and the display substrate is thinned. Meanwhile, since the coil portion 70 is formed of the first and second conductive wires 701 and 702 arranged crosswise, that is, the coil portion 70 has a mesh structure, it does not affect the display effect of the display apparatus to which the display substrate is applied. Meanwhile, since the first conductive wire 701 and the second conductive wire 702 of the coil portion 70 are at least a part of the first conductive structure 700 and the second conductive structure 800 of the conductive mesh, respectively, and the first conductive structure 700 and the second conductive structure 800 of the conductive mesh are located in the display area Q1 and the peripheral area Q2, display uniformity of the display apparatus to which the display substrate is applied may be secured. In addition, in an embodiment of the present disclosure, the orthographic projections of the first conductive structure 700 and the second conductive structure 800 on the base substrate overlap the orthographic projections of the first signal line and the second signal line in the display substrate on the base substrate, respectively, so that a pixel aperture ratio of the display substrate is not affected.

In some examples, the display substrate includes not only the above-described structure but also a plurality of sub-pixels arranged on the base substrate 10. The sub-pixels arranged side by side in the first direction X form a first pixel group, and the sub-pixels arranged side by side in the second direction Y form a second pixel group; a first conductive structure 700 is arranged between two adjacent first pixel groups in at least a portion of the first pixel groups, and a second conductive structure 800 is arranged between two adjacent second pixel groups in at least a portion of second first pixel groups. For example, between every two adjacent first pixel groups is arranged one first conductive structure 700; and between every two adjacent second pixel group is arranged one second conductive structure 800. This is because a non-light-transmitting area is formed between two adjacent first pixel groups and between two adjacent second pixel groups, so that the first conductive structure 700 is arranged between two adjacent first pixel groups, and the second conductive structure 800 is arranged between two adjacent second pixel groups, which does not affect the pixel aperture ratio of the display substrate.

In some examples, the orthographic projections of the second signal line and the second conductive structure 800, which are correspondingly arranged, on the base substrate 10 partially overlap in the first direction X, that is, the second signal line and the second conductive structure 800, which are correspondingly arranged, deviate from each other in the first direction X, so as to avoid a problem of displaying blue light on a display surface where the display substrate is applied.

In some examples, the first signal line may be a gate line GL, and the second signal line may be a data line DL. In some examples, the second signal line may alternatively be a touch signal line TX. The first signal line is not limited to be the gate line GL, and the second signal line is not limited to be the data line DL or the touch signal line TX. In the embodiments of the present disclosure, as an example, the first signal line is the gate line GL, the second signal line is the data line DL; or, the first signal line is the gate line GL, and the second signal line is the touch signal line TX. The display substrate according to an embodiment of the present disclosure will be specifically described below for each of these two cases.

Figure 5:
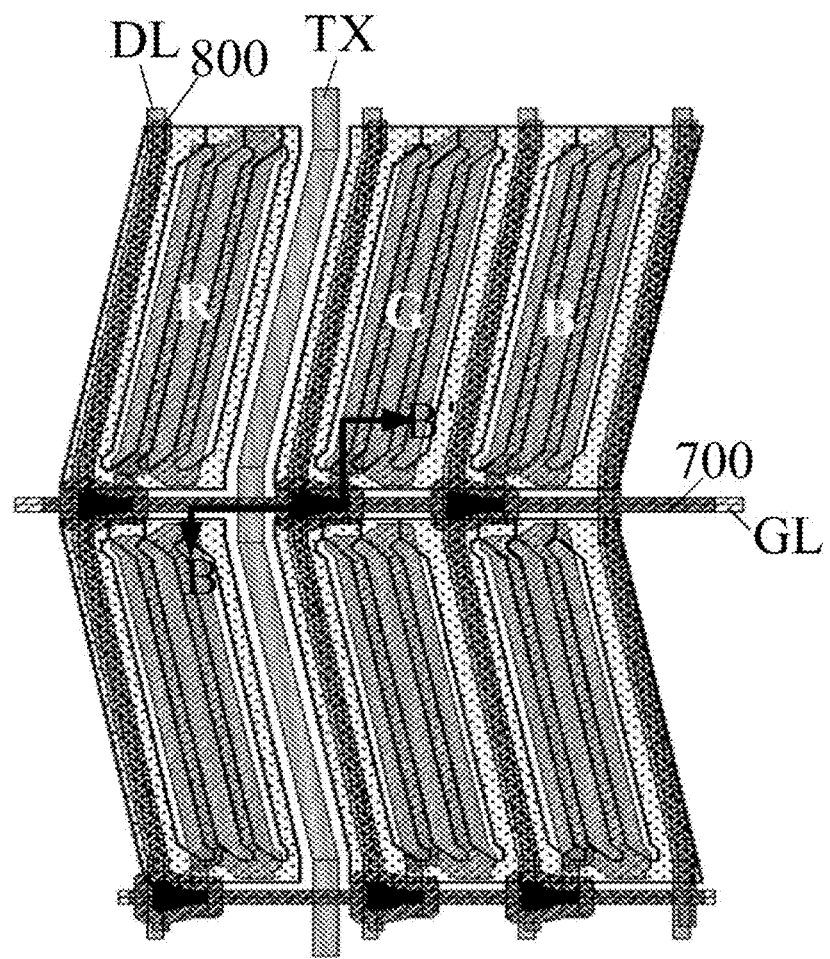
FIG. 5 is a layout of a display substrate according to an embodiment of the present disclosure.
Figure 6:
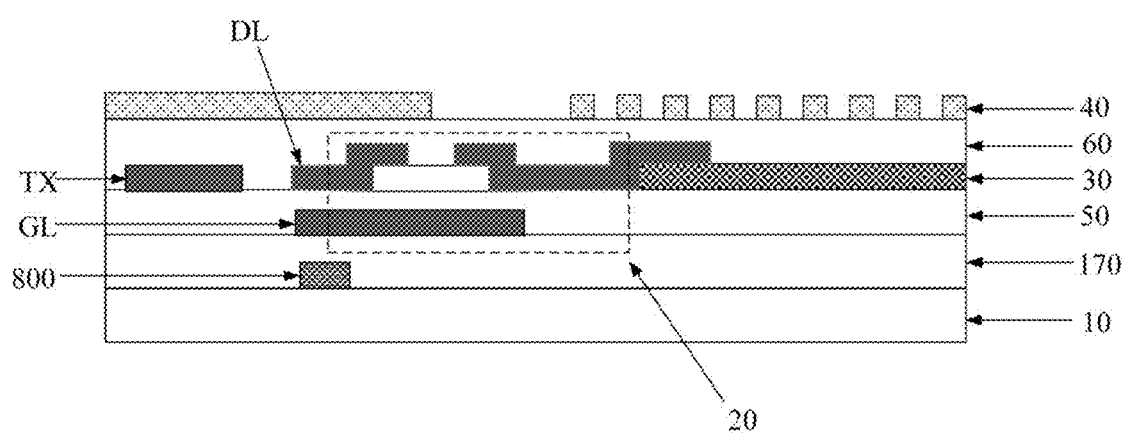
FIG. 6 is a cross-sectional view taken along B-B' of the display substrate shown in FIG. 5.

FIG. 5 is a layout of a display substrate according to an embodiment of the present disclosure. FIG. 6 is a cross-sectional view taken along B-B' of the display substrate shown in FIG. 5. In a first example, as shown in FIGS. 5 and 6, in the display substrate, the first signal line is a gate line GL, and the second signal line is a data line DL. Each of the sub-pixels includes a thin film transistor 20, a pixel electrode 30, and a common electrode 40. Gate electrodes of the thin film transistors 20 of the sub-pixels in a same first pixel group are connected to a same gate line GL, and each are provided with a gate scanning signal by this gate line GL. Source electrodes of the thin film transistors 20 of the sub-pixels in a same second pixel group are connected to a same data line DL, and each are provided with a data voltage signal by this data line. A drain electrode of the thin film transistor 20 in each sub-pixel is connected to the pixel electrode 30 in this sub-pixel. With continued reference to FIG. 6, the display substrate includes: a base substrate 10; a conductive mesh (only a second conductive structure 800 is illustrated in the figure) arranged on the base substrate 10; a second interlayer insulating layer 170 arranged on a side of the conductive mesh away from the base substrate 10; a gate electrode and a gate line GL of the thin film transistor 20 arranged on a side of the second interlayer insulating layer 170 away from the base substrate 10, wherein the gate electrode of the thin film transistor 20 and the gate line GL connected thereto have a one-piece structure; a first interlayer insulating layer 50 arranged on a side of a layer, where the gate electrode of the thin film transistor 20 and the gate line GL are located, away from the base substrate 10; an active layer of the thin film transistor 20 arranged on a side of the first interlayer insulating layer 50 away from the base substrate 10; a source electrode and a drain electrode of the thin film transistor 20, a data line DL and a pixel electrode 30 arranged on a side of the active layer of the thin film transistor 20 away from the base substrate, wherein the source electrode of the thin film transistor 20 and the data line DL are connected to each other and have a one-piece structure, the drain electrode of the thin film transistor 20 is directly connected to the pixel electrode 30, and the pixel electrode 30 may be formed prior to forming the source and the drain electrodes of the thin film transistor 20; a third interlayer insulating layer 60 arranged on a side of a layer, where the source and drain electrodes of the thin film transistor 20, the data line DL and the pixel electrode 30 are located, away from the base substrate 10; and a common electrode 40 arranged on a side of the third interlayer insulating layer 60 away from the base substrate. The first conductive structures 700 in the conductive mesh are arranged in a one-to-one correspondence with the gate lines GL, and orthographic projections of the gate line G and the first conductive structure 700, which are correspondingly arranged, on the base substrate 10 at least partially overlap. The second conductive structures 800 in the conductive mesh are arranged in a one-to-one correspondence with the data lines DL, and orthographic projections of the second conductive structure 800 and the data line DL, which are correspondingly arranged, on the base substrate 10 at least partially overlap. In an embodiment of the present disclosure, the first conductive wire 701 of the coil portion 70 of the near field communication antenna is at least a part of the first conductive structure 700, and the second conductive wire 702 is at least a part of the second conductive portion 800. In this case, only the first conductive structure 700 needs to be subjected to a breakpoint processing to segment the first conductive wires 701, and the second conductive structure 800 needs to be subjected to the breakpoint processing to segment the second conductive wires 702, which is a simple process.

In some examples, the common electrode 40 in a sub-pixel may be multiplexed as a touch electrode. For example, the common electrodes 40 in the plurality of sub-pixels arranged in an array are connected to each other, forming a one-piece structure, and serve as a touch electrode, and each touch electrode is connected to one touch signal line TX, and the touch signal line TX is located between two second pixel groups arranged adjacently. In this case, in a display stage, a common voltage signal is input to the touch signal line TX, and the touch electrode serves as a common electrode. In a touch stage, a touch signal is input to the touch signal line TX, and a touch position is determined by reading a signal output by the touch signal line TX. In some examples, the touch signal line TX and the data line DL may be arranged in a same layer and made of a same material, that is, both of them may be prepared through a one-patterning process. In addition, it should be noted that in order to avoid the common electrode from affecting a signal transmission of the near field communication antenna, openings may be formed at positions of the common electrode corresponding to the first conductive wire 701 and the second conductive wire 702 of the coil portion 70.

Furthermore, the sub-pixels in the same second pixel group have a same color, and the sub-pixels in the two adjacent second pixel groups have different colors. As an example, the display substrate includes sub-pixels of three colors, for example, the sub-pixels of three colors may be a red sub-pixel R, a green sub-pixel G, and a blue sub-pixel B, respectively. Every three sub-pixels arranged side by side in the first direction X constitute a pixel unit, that is, each pixel unit includes a red sub-pixel R, a green sub-pixel G, and a green sub-pixel B. The pixel units arranged side by side in the second direction Y form a pixel unit group; each pixel unit group is provided with one touch signal line TX. For example, a touch signal line TX is arranged in each pixel unit group, and the touch signal line TX is arranged between the second pixel group formed by the red sub-pixels R and the second pixel group formed by the green sub-pixels G. The reason for this arrangement is that a color crosstalk risk of the red sub-pixel R is large, so that a width of the black matrix formed at a position between the red sub-pixel R and the green sub-pixel G in the color filter substrate is wider than that of the other positions, thus the pixel aperture ratio is not affected by the touch signal line arranged at this position.

In some examples, referring to FIG. 3, the near field communication antenna has a first end 703 and a second end 704, the first end 703 and the second end 704 are configured to be electrically connected to a control circuit to form a closed loop, and an induced current loop may be formed in the near field communication antenna and the control circuit by an external magnetic induction coil, to achieve the near field communication. Taking the case of the near field communication antenna including one coil portion 70 as an example, a first end and a second end of the coil portion 70 serve as the first end 703 and the second end 704 of the near field communication antenna, respectively. The control circuit is integrated in a driving chip (IC). The peripheral area Q2 has at least one first connecting electrode and at least one second connecting electrode, the number of which depends on the number of pins of the driving chip, so that the first connecting electrode and the second connecting electrode are electrically connected to the pins of the driving chip, to electrically connect the first end and the second end of the coil portion to the control circuit in the driving chip. The following description will be given taking as an example that the number of the first connecting electrodes and the number of the second connecting electrodes each are one or more, respectively.

Figure 7:
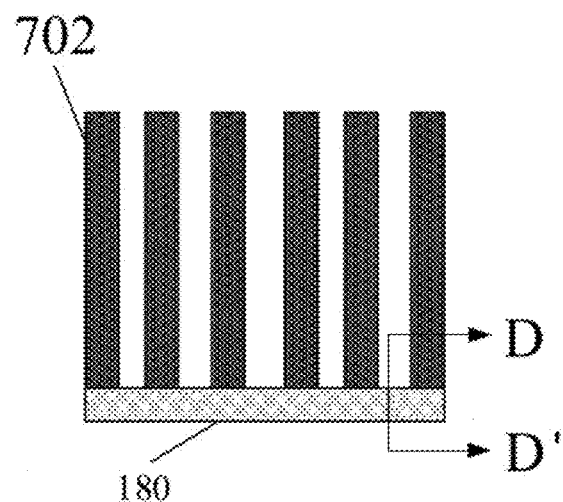
FIG. 7 is a partial top view of a peripheral area of a display substrate according to an embodiment of the present disclosure.
Figure 7A:
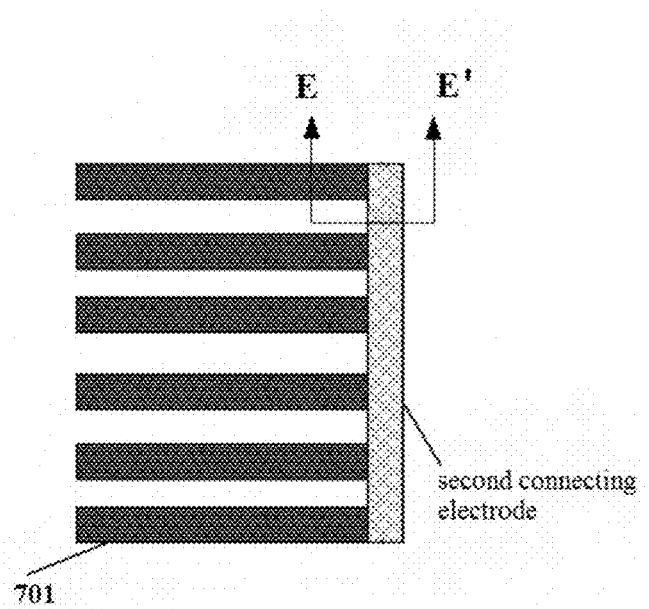
FIG. 7a is another partial top view of a peripheral area of a display substrate according to an embodiment of the present disclosure.
Figure 8:
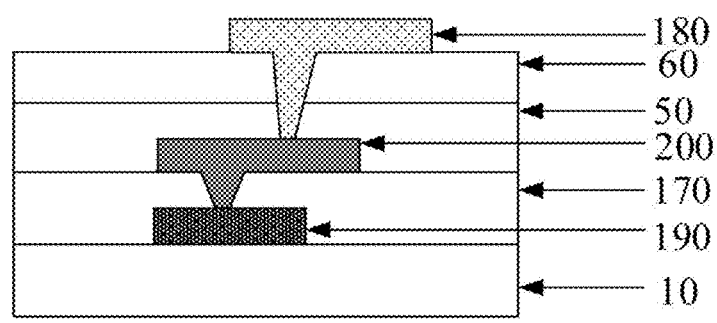
FIG. 8 is a cross-sectional view taken along D-D' in FIG. 7.
Figure 8A:
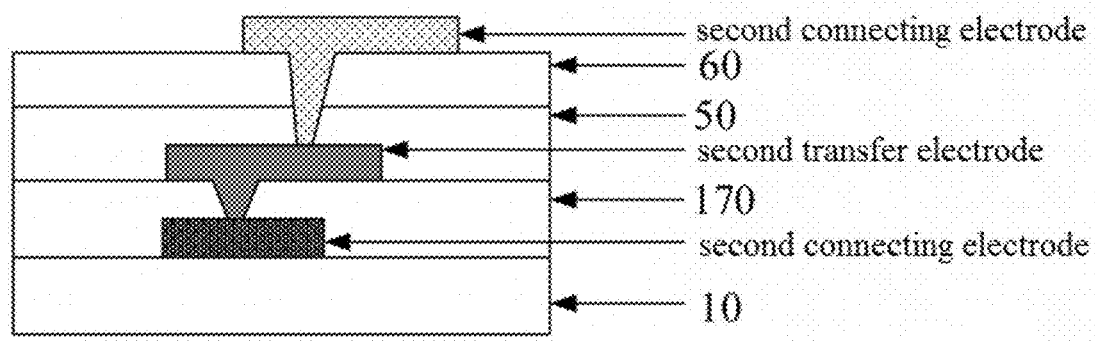

FIG. 7 is a partial top view of a peripheral area of a display substrate according to an embodiment of the present disclosure; FIG. 7a is another partial top view of a peripheral area of a display substrate according to an embodiment of the present disclosure; FIG. 8 is a cross-sectional view taken along D-D' in FIG. 7; and FIG. 8a is another cross-sectional view taken along E-E' in FIG. 7a. In one example, as shown in FIGS. 7, 7a, 8, and 8a, the second conductive wire 702 in each of the first end and the second end of the coil portion 70 of the near field communication antenna extends into the peripheral area Q2. A first shorting bar 190, a second shorting bar, a first transfer electrode 200, a second transfer electrode, a first connecting electrode 180, and a second connecting electrode are further arranged in the peripheral area Q2. The first shorting bar 190 shorts (forms a short circuit among) the second conductive wires 702 in the first end of the coil portion 70, and the second shorting bar shorts (forms a short circuit among) the second conductive wires 702 in the second end of the coil portion 70. The first shorting bar 190 and the second shorting bar are in a same layer and are made of a same material as the conductive mesh, so that the first shorting bar, the second shorting bar and the conductive mesh may be formed through a one-patterning process. The first transfer electrode 200 and the second transfer electrode are arranged in a same layer as the gate line GL, the first transfer electrode 200 is electrically connected to the first shorting bar 190 through a via penetrating through the second interlayer insulating layer 170, and the second transfer electrode is electrically connected to the second shorting bar through a via penetrating through the second interlayer insulating layer 170. The first connecting electrode 180 and the second connecting electrode are arranged in a same layer as the common electrode 40, the first connecting electrode 180 is electrically connected to the first transfer electrode 200 through a via penetrating through the first interlayer insulating layer 50 and the third interlayer insulating layer 60, and the second connecting electrode is electrically connected to the second transfer electrode through a via penetrating through the first interlayer insulating layer 50 and the third interlayer insulating layer 60. In this way, the second conductive wires 702 in the first end of the coil portion 70 are electrically connected to the first connecting electrode 180 through the first shorting bar 190 and the first transfer electrodes 200. Similarly, the second conductive wires 702 in the second end of the coil portion 70 are electrically connected to the second connecting electrode through the second shorting bar and the second transfer electrode.

In another example, the second conductive wire 702 at each of the first and second ends of the coil portion 70 of the near field communication antenna extends into the peripheral area Q2, and a plurality of first shorting bars 190, a plurality of second shorting bars, a plurality of first transfer electrodes 200, a plurality of second transfer electrodes, a plurality of first connecting electrodes 180, and a plurality of second connecting electrodes are further arranged in the peripheral area Q2. The first shorting bar 190 and the second shorting bar are arranged in a same layer as the conductive mesh, the first transfer electrode 200 and the second transfer electrode are arranged in a same layer as the gate line GL, and the first connecting electrode 180 and the second connecting electrode are arranged in a same layer as the common electrode 40. The first shorting bars 190 are arranged in a one-to-one correspondence with the first transfer electrodes 200, and the first transfer electrodes 200 are arranged in a one-to-one correspondence with the first connecting electrodes 180. The first shorting bar 190 and the first transfer electrode 200, which are correspondingly arranged, are electrically connected to each other through vias penetrating through the second interlayer insulating layer 170, respectively. The first transfer electrodes 200 and the first connecting electrodes 180, which are correspondingly arranged, are electrically connected to each other through vias penetrating through the first interlayer insulating layer 50 and the third interlayer insulating layer 60, respectively. Accordingly, the second shorting bars are arranged in a one-to-one correspondence with the second transfer electrodes, and the second transfer electrodes are arranged in a one-to-one correspondence with the second connecting electrodes. The second shorting bars and the second transfer electrodes, which are correspondingly arranged, are electrically connected to each other through vias penetrating through the second interlayer insulating layer 170, respectively. The second transfer electrodes and the second connecting electrodes, which are correspondingly arranged, are electrically connected to each other through vias penetrating through the first interlayer insulating layer 50 and the third interlayer insulating layer 60, respectively. A plurality of second conductive wires 702 adjacently arranged in the first end of the coil portion 70 are shorted by one first shorting bar 190, and the second conductive wires 702, to which different first shorting bars 190 are connected, are different from each other. Similarly, a plurality of second conductive wires 702 adjacently arranged in the second end of the coil portion 70 are shorted by one second shorting bar, and the second conductive wires 702, to which different second shorting bars are connected, are different from each other. It should be noted that the numbers of the second conductive wires 702 connected to the respective first shorting bars 190 may be the same or different from each other. For example, the number of the first shorting bars 190 is i, and the number of the second conductive wires 702 arranged in the first end of the coil portion 70 is j, if j/i is an integer, each first shorting bar 190 is connected to j/i number of second conductive wires, that is, the numbers of the second conductive wires 702 connected to the respective first shorting bars 190 are the same; if j/i is a non-integer, the numbers of the second conductive wires 702 connected to the respective first shorting bars 190 may alternatively be different from each other.

Figure 9:
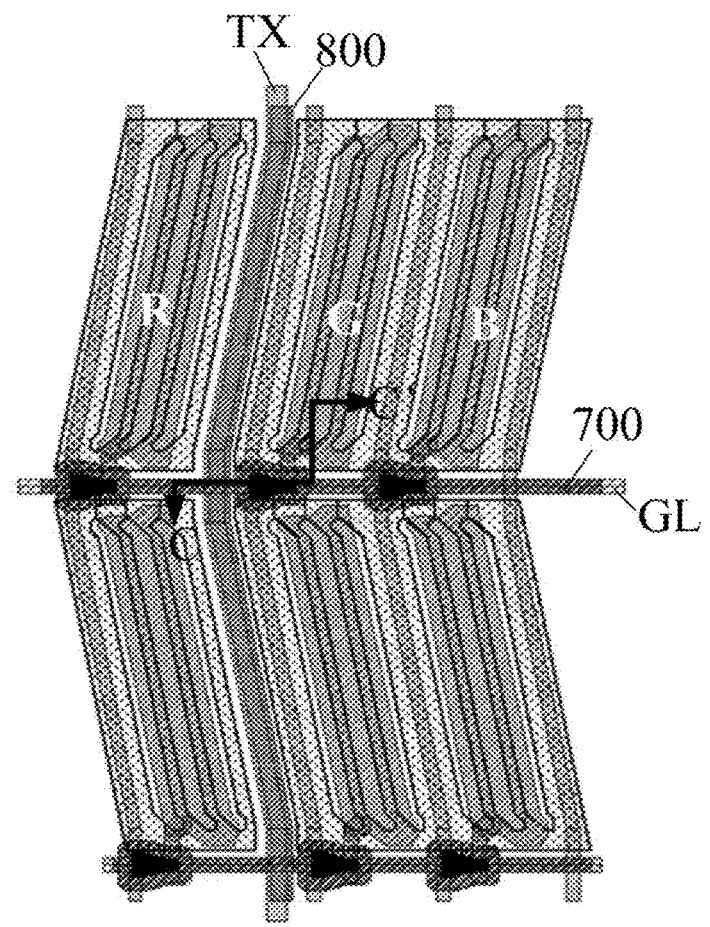
FIG. 9 is a layout of a display substrate according to an embodiment of the present disclosure.
Figure 10:
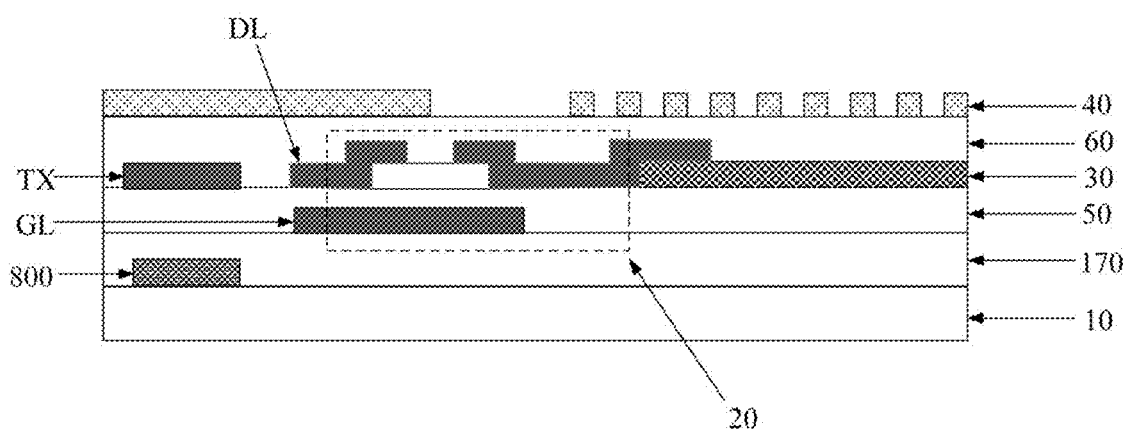
FIG. 10 is a cross-sectional view taken along C-C' in FIG. 9.

FIG. 9 is a layout of a display substrate according to an embodiment of the present disclosure; FIG. 10 is a cross-sectional view taken along C-C' in FIG. 9. In a second example, as shown in FIGS. 9 and 10, the first signal line in the display substrate is a gate line GL, and the second signal line is a touch signal line TX. The display substrate has substantially the same structure as the display substrate shown in FIG. 5, except that the second conductive structures 800 of the conductive mesh are arranged in a one-to-one correspondence with the touch signal lines TX, and the orthographic projections of the second conductive structure 800 and the touch signal line, which are correspondingly arranged, on the base substrate 10 at least partially overlap. The position of the touch signal line TX and the positions of the other film layers are the same as those in the first example, and therefore the description thereof is not repeated.

Figure 11:
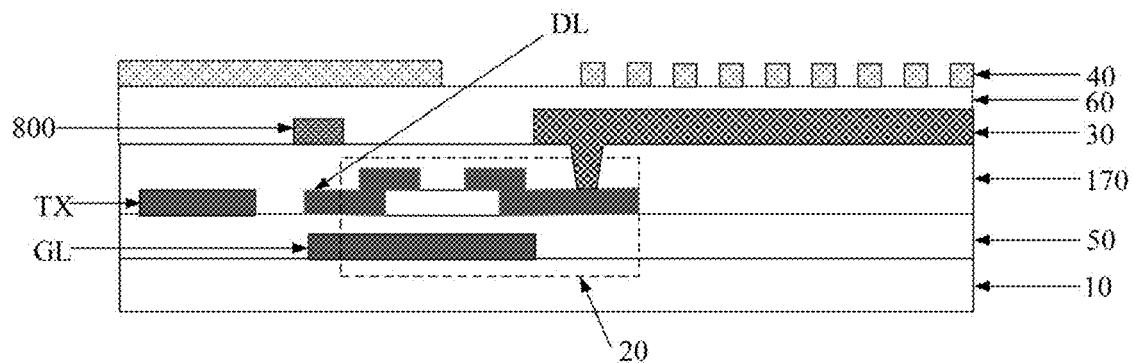
FIG. 11 is a cross-sectional view of another display substrate according to an embodiment of the present disclosure.

In a third example, in the display substrate, the first signal line is a gate line, and the second signal line is a data line. FIG. 11 is a cross-sectional view of another display substrate according to an embodiment of the present disclosure. As shown in FIG. 11, the structure of the sub-pixels and the conductive mesh in the display substrate are the same as those in the first example, except for a distribution of the film layers. Specifically, the display substrate includes: a base substrate 10; a gate electrode of a thin film transistor 20 and a gate line GL arranged on the base substrate 10, wherein the gate electrode of the thin film transistor 20 and the gate line GL connected to the gate electrode have a one-piece structure; a first interlayer insulating layer 50 arranged on a side of a layer, where the gate electrode of the thin film transistor 20 and the gate line GL are arranged, away from the base substrate 10; an active layer of the thin film transistor 20 arranged on a side of the first interlayer insulating layer 50 away from the base substrate 10; a source electrode and a drain electrode of the thin film transistor 20, and a data line DL, arranged on a side of the active layer of the thin film transistor 20 away from the base substrate 10; a second interlayer insulating layer 170 arranged on a layer where the source and drain electrodes of the thin film transistor 20, and the data line DL are arranged; a conductive mesh and a pixel electrode 30 arranged on a side of the second interlayer insulating layer 170 away from the base substrate 10, wherein the pixel electrode 30 is electrically connected to the drain electrode of the thin film transistor 20 through a via penetrating through the second interlayer insulating layer 170; a third interlayer insulating layer 60 arranged on a side of a layer, where the conductive mesh and the pixel electrode 30 are arranged, away from the base substrate 10; and a common electrode 40 arranged on a side of the third interlayer insulating layer 60 away from the base substrate. It can be seen that in this display substrate, since the second interlayer insulating layer 170 is arranged between the pixel electrode 30 and the source and drain electrodes of the thin film transistor 20, the conductive mesh may be arranged on the second interlayer insulating layer 170. The first conductive structures 700 in the conductive mesh are arranged in a one-to-one correspondence with the gate lines GL, and orthographic projections of the gate line GL and the first conductive structure 700, which are correspondingly arranged, on the base substrate 10 at least partially overlap. The second conductive structures 800 in the conductive mesh are arranged in a one-to-one correspondence with the data lines DL, and orthographic projections of the second conductive structures 800 and the data lines DL, which are correspondingly arranged, on the base substrate 10 at least partially overlap. In an embodiment of the present disclosure, the first conductive wire 701 of the coil portion 70 of the near field communication antenna is at least a part of the first conductive structure 700, and the second conductive wire 702 is at least a part of the second conductive portion 800. In this case, only the first conductive structure 700 needs to be subjected to a breakpoint processing to segment the first conductive wires 701, and the second conductive structure 800 needs to be subjected to the breakpoint processing to segment the second conductive wires 702, which is a simple process.

Alternatively, the display substrate may also realize a touch function as in the first example, and the touch signal lines TX are arranged in a same manner as in the first example, and therefore the description thereof is not repeated here.

Figure 12:
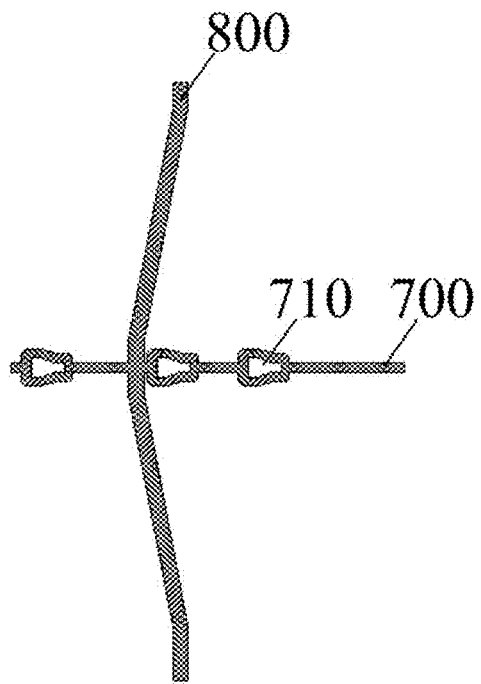
FIG. 12 is a schematic diagram of a part of a conductive structure according to an embodiment of the present disclosure.

In some examples, since the gate electrodes of the thin film transistors 20 and the gate line GL connected thereto are connected to each other, forming a one-piece structure, both of them may be formed through a patterning process using a same mask. FIG. 12 is a schematic diagram of a part of a conductive mesh of an embodiment of the present disclosure. As shown in FIG. 12, in an embodiment of the present disclosure, an orthographic projection of the first conductive structure 700 of the conductive mesh on the base substrate 10 may overlap an orthographic projection of the gate line GL and orthographic projections of the gate electrodes of the thin film transistors 20 electrically connected to the gate line GL on the base substrate 10. However, since the orthographic projections of the gate electrodes of the thin film transistors 20 on the base substrate 10 overlap orthographic projections of the active layers of the thin film transistors 20 on the base substrate 10, a plurality of first openings 710 are formed in the first conductive structure 700, the first openings 710 are arranged in a one-to-one correspondence with the active layers of the thin film transistors 20, and the orthographic projection of the first opening 710, which is arranged corresponding to an active layer of a thin film transistor 20, on the base substrate 10 covers the orthographic projection of this active layer of the thin film transistor 20 on the base substrate 10. In this way, it may be effectively avoided that the first conductive structure 700 on the active layer of the thin film transistor 20 affects a switching performance of the thin film transistor 20 during the first conductive structure 700 transmits a signal.

In some examples, the near field communication antenna has a first end and a second end, the first end and the second end are configured to be electrically connected to a control circuit to form a closed loop, and an induced current loop may be formed in the near field communication antenna and the control circuit by an external magnetic induction coil, to achieve the near field communication. Taking the case of the near field communication antenna including one coil portion 70 as an example, a first end and a second end of the coil portion 70 serve as the first end and the second end of the near field communication antenna, respectively. The control circuit is integrated in a driving chip (IC). The peripheral area has at least one first connecting electrode and at least one second connecting electrode, the number of which depends on the number of pins of the driving chip, so that the at least one first connecting electrode and the at least one second connecting electrode are electrically connected to the pins of the driving chip, to electrically connect the first end and the second end of the coil portion 70 to the control circuit in the driving chip. The following description will be given taking the case that the number of the first connecting electrodes and the number of the second connecting electrodes each are one or more, respectively, as an example.

Figure 13:
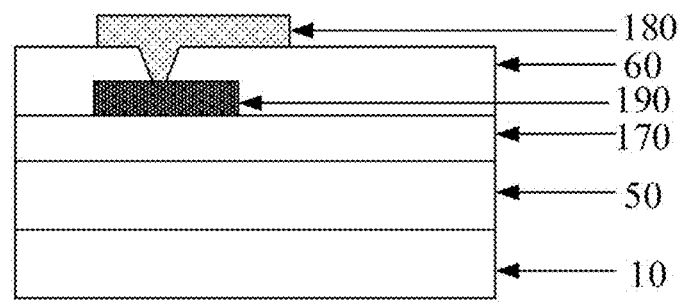
FIG. 13 is a partial cross-sectional view of a peripheral area of the display substrate shown in FIG. 11.
Figure 13A:
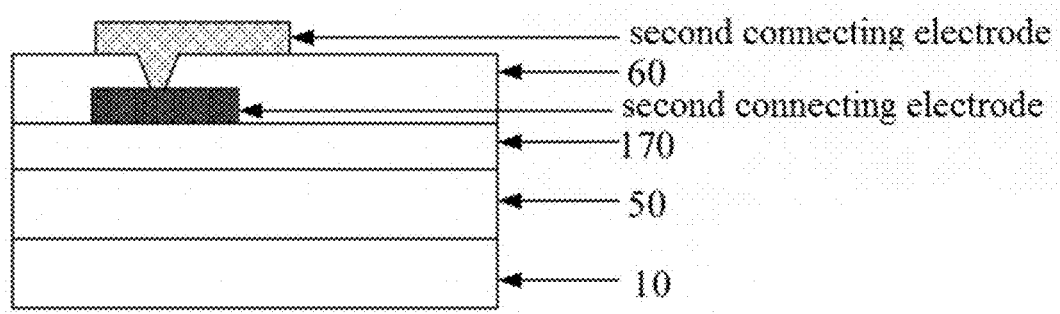
FIG. 13a is another partial cross-sectional view of a peripheral area of the display substrate shown in FIG. 11.

In one example, FIG. 13 is a partial cross-sectional view of a peripheral area of the display substrate shown in FIG. 11; and FIG. 13a is another partial cross-sectional view of a peripheral area of the display substrate shown in FIG. 11. As shown in FIGS. 13 and 13a, the second conductive wires in the first and second ends of the coil portion 70 of the near field communication antenna extend into the peripheral area Q2. A first shorting bar 190, a second shorting bar, a first connecting electrode 180, and a second connecting electrode are further arranged in the peripheral area Q2. The first shorting bar 190 shorts the second conductive wires 702 in the first end of the coil portion 70, and the second shorting bar shorts the second conductive wires in the second end of the coil portion 70. The first shorting bar 190 and the second shorting bar are in a same layer and are made of a same material as the conductive mesh, so that the first shorting bar, the second shorting bar and the conductive mesh may be formed through a one-patterning process. The first connecting electrode 180 and the second connecting electrode are both arranged in a same layer as the common electrode 40, the first connecting electrode 180 is electrically connected to the first shorting bar 190 through a via penetrating through the third interlayer insulating layer 60, and the second connecting electrode is electrically connected to the second shorting bar through a via penetrating through the third interlayer insulating layer 60. As described above, the second conductive wires 702 in the first end of the coil portion 70 are electrically connected to the first connecting electrodes 180 through the first shorting bar 190. Similarly, the second conductive wires 702 in the second end of the coil portion 70 are electrically connected to the second connecting electrode through the second shorting bar.

In another example, the second conductive wires 702 in the first and second ends of the coil portion 70 of the near field communication antenna each extend into the peripheral area Q2. A plurality of first shorting bars 190, a plurality of second shorting bars, a plurality of first connecting electrodes 180, and a plurality of second connecting electrodes are further arranged in the peripheral area Q2. The same as the above example, the first shorting bars 190 and the second shorting bars are both arranged in a same layer as the conductive mesh, and the first connecting electrodes 180 and the second connecting electrodes are both arranged in a same layer as the common electrode 40. The first shorting bars 190 are arranged in a one-to-one correspondence with the first connecting electrodes 180; the first shorting bar 190 and the first connecting electrode 180, which are correspondingly arranged, are electrically connected to each other through a via penetrating through the third interlayer insulating layer 60. Accordingly, the second shorting bars are arranged in a one-to-one correspondence with the second connecting electrodes; the second shorting bar and the second connecting electrode, which are correspondingly arranged, are electrically connected to each other through a via penetrating through the third interlayer insulating layer 60. A plurality of adjacently arranged second conductive wires 702 in the first end of the coil portion 70 are shorted by one first shorting bar 190, and the second conductive wires 702, to which different first shorting bars 190 are connected, are different from each other. Similarly, a plurality of second conductive wires 702 adjacently arranged in the second end of the coil portion 70 are shorted by one second shorting bar, and the second conductive wires 702, to which different second shorting bars are connected, are different from each other. It should be noted that, the numbers of the second conductive wires connected to the respective first shorting bars may be the same or different from each other. For example, the number of the first shorting bars 190 is i, the number of the second conductive wires 702 arranged in the first end of the coil portion 70 is j. If j/i is an integer, each first shorting bar 190 is connected to j/i second conductive wires, that is, the numbers of the second conductive wires 702 connected to the respective first shorting bars 190 are the same; if j/i is a non-integer, the numbers of the second conductive wires 702 connected to the respective first shorting bars 190 may alternative be different from each other.

Figure 14:
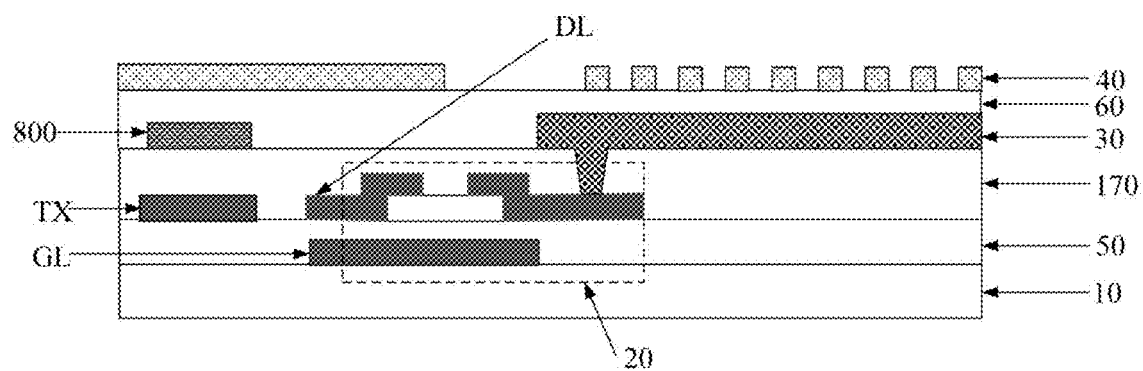
FIG. 14 is another cross-sectional view of a display substrate according to an embodiment of the present disclosure.

FIG. 14 is another cross-sectional view of a display substrate according to an embodiment of the present disclosure. In a fourth example, as shown in FIG. 14, the first signal line in the display substrate is a gate line, and the second signal line is a touch signal line. The display substrate has substantially the same structure as the display substrate shown in FIG. 11, except that the second conductive structures 800 of the conductive mesh are arranged in a one-to-one correspondence with the touch signal lines TX, and the orthographic projections of the second conductive structure 800 and the touch signal line TX, which are correspondingly arranged, on the base substrate 10 at least partially overlap. The position of the touch signal line TX and the positions of other film layers are the same as those of the third example, and therefore the description thereof is not repeated. In an embodiment of the present disclosure, the display area Q1 includes at least one first area Q11 and a second area Q12, wherein the first area Q11 is configured to arrange a near field communication antenna, and in each of the at least one first area Q11 is arranged one coil portion 70 of the near field communication antenna. The other area of the display area Q1 except the first area Q11 is referred to as the second area Q12. The peripheral area Q2 includes a first pad area Q21 and a second pad area Q22 located at opposite sides of the display area Q1 in the second direction Y. Where the display area Q1 includes only one first area Q11, this first area Q11 may be arranged on a side of the second area Q12 close to the first pad area Q21 or on a side of the second area Q12 close to the second pad area Q22. This facilitates connection of the coil portion of the near field communication antenna in the first area Q11 to a driving chip (IC). Similarly, if the display area Q1 includes two first areas Q11, one of the first areas Q11 is located on a side of the second area Q12 close to the first pad area Q21, and the other of the first areas Q11 is located on a side of the second area Q12 close to the second pad area Q22. Alternatively, more first areas Q11 may be arranged in the display area Q1 of the display substrate in an embodiment of the present disclosure, that is, more coil portions 70 of the near field communication antenna may be integrated in the display substrate. In the following description, only a case where the display area Q1 of the display substrate has one or two first areas Q11, that is, one or two coil portions 70 of the near field communication antenna is integrated in the display substrate, will be described as an example.

Figure 15:
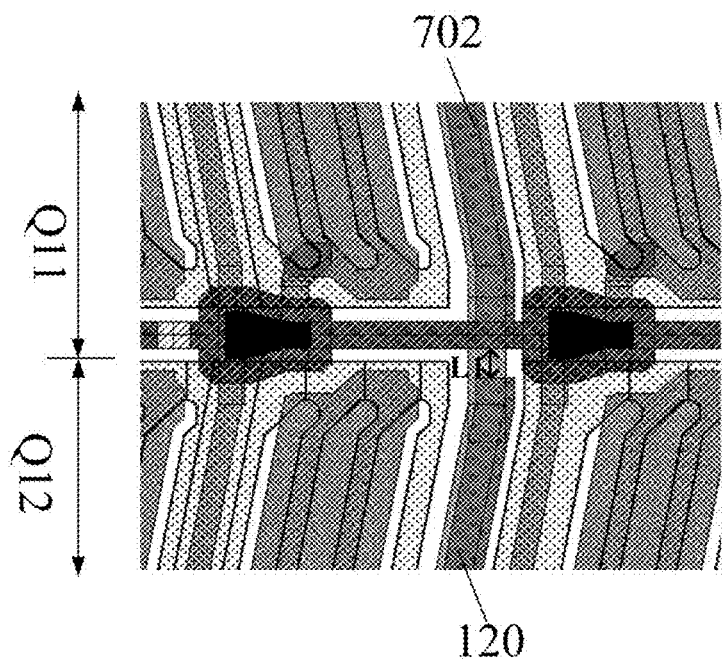
FIG. 15 is a schematic diagram of a part of a layout of a display substrate according to an embodiment of the present disclosure.

FIG. 15 is a schematic diagram of a part of a layout of a display substrate according to an embodiment of the present disclosure. In some examples, as shown in FIGS. 4 and 15, the display substrate includes not only the coil portion 70 arranged in the first area Q11 but also a plurality of third conductive wires 110 and a plurality of fourth conductive wires 120 arranged in the second area Q12 and the peripheral area Q2. The third conductive wires 110 and the fourth conductive wires 120 are arranged crosswise, and the third conductive wire 110 is at least a part of the first conductive structure 700; the fourth conductive wire 120 is at least a part of the second conductive structure 800. In this case, the first conductive structures 700 and the second conductive structures 800 are uniformly distributed in the display area Q1, which facilitates a uniformity of the aperture ratio of the display substrate. In order to prevent the signal of the coil portion 70 from being coupled to the second area Q12, the second conductive wire 702 and the fourth conductive wire 120 belonging to a same second conductive structure 800 are disconnected from each other, and a distance L1 therebetween is about in a range of 2 μm to 6 μm, for example, the distance L1 therebetween is 4 μm.

Further, the display substrate includes not only the above-described structure but also a signal lead-in line 400 arranged on the base substrate 10 and in the peripheral area Q2. Where the above-described third and fourth conductive wires 110 and 120 are arranged in the second area Q12, the third and/or fourth conductive wires 110 and 120 may be electrically connected to the signal lead-in line 400. A voltage signal provided by the signal lead-in line 400 to the third conductive wire 110 and the fourth conductive wire 120 depends on a signal written by the driving chip to the first conductive wire 701 and the second conductive wire 702 when the coil portion 70 is not in operation. A consistent influence of the conductive mesh on the sub-pixels of the display substrate is ensured by writing the same signal to the first conductive wire 701, the second conductive wire 702, the third conductive wire 110 and the fourth conductive wire 120. For example, when the coil portion 70 is not in operation, the signal written to the first conductive wire 701 and the second conductive wire 702 is a ground signal, in this case, the signal lead-in line 400 is a ground signal line, the signal lead-in line 400 may be arranged in a same layer as the gate line GL, and the fourth conductive wire 120 and the signal lead-in line 400 prevent the third conductive wire 110 and the fourth conductive wire 120 from being in a floating state. Specifically, if the display substrate is the display substrate shown in FIG. 6 or 10, the fourth conductive wire 120 may be electrically connected to the signal lead-in line 400 through a via penetrating through the second interlayer insulating layer 170. If the display substrate is the display substrate shown in FIG. 11 or 14, the fourth conductive wire 120 may be electrically connected to the signal lead-in line through a via penetrating through the first interlayer insulating layer 50 and the second interlayer insulating layer 170.

Alternatively, the signal lead-in line 400 may include a first signal lead-in sub-line extending in the first direction and a second signal lead-in sub-line extending in the second direction. The first signal lead-in sub-line may be arranged in a same layer and made of a same material as the gate line GL, and the second signal lead-in sub-line may be arranged in a same layer and made of a same material as the data line DL. In this case, the first and second signal lead-in sub-lines are electrically connected to each other through a via penetrating through the first interlayer insulating layer 50. The third conductive wire 110 is electrically connected to the second signal lead-in sub-line, and the fourth conductive wire 120 is electrically connected to the first signal lead-in sub-line. Specifically, if the display substrate is the display substrate shown in FIG. 6 or 10, the third conductive wire 110 may be electrically connected to the second signal lead-in sub-line through a via penetrating through the first interlayer insulating layer 50 and the second interlayer insulating layer 170, and the fourth conductive wire 120 may be electrically connected to the first signal lead-in sub-line through a via penetrating through the second interlayer insulating layer 170. If the display substrate is the display substrate shown in FIG. 11 or 14, the third conductive wire 110 may be electrically connected to the second signal lead-in sub-line through a via penetrating through the second interlayer insulating layer 170, and the fourth conductive wire 120 may be electrically connected to the first signal lead-in sub-line through a via penetrating through the first interlayer insulating layer 50 and the second interlayer insulating layer 170.

It should be noted that, when an outline of the peripheral area is rectangular, the signal lead-in line 400 may include two first signal lead-in sub-lines and two second signal lead-in sub-lines. The two first signal lead-in sub-lines are arranged side by side in the second direction Y, and the two second signal lead-in sub-lines are arranged side by side in the first direction X. When the third conductive wire 110 is connected to the second signal lead-in sub-lines, two ends of the third conductive wire 110 may be connected to the two second signal lead-in sub-lines, respectively (each of two ends of the third conductive wire 110 is connected to the second signal lead-in sub-line closest to this end); when the fourth conductive wire 120 is connected to the first signal lead-in sub-lines, an end of the fourth conductive wire 120 away from the first area Q11 is connected to the first signal lead-in sub-line closest to this end.

Figure 16:
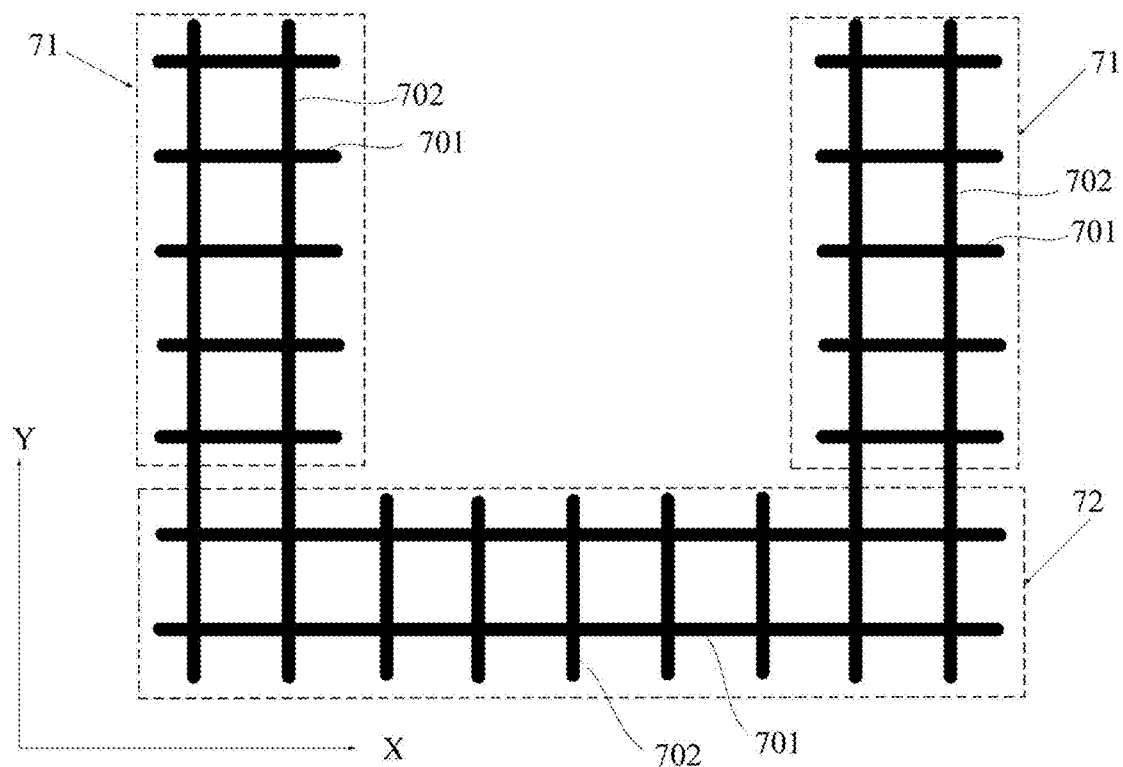
FIG. 16 is a schematic diagram of a near field communication antenna in a display substrate according to an embodiment of the present disclosure.

FIG. 16 is a schematic diagram of a near field communication antenna in a display substrate of an embodiment of the present disclosure. In some examples, as shown in FIG. 16, the near field communication antenna may include only one coil portion 70, and the coil portion 70 may include at least two sub-structures having different extending directions, wherein each of the sub-structures includes the first conductive wire 701 and the second conductive wire 702. For example, the coil portion 70 may be of a "V" shape, a "U" shape, or the like. In an embodiment of the present disclosure, the coil portion 70 is described as an example in a "U" shape. As shown in FIG. 16, the coil portion 70 includes two first sub-structures 71 arranged side by side in the first direction X and extending in the second direction Y, and one second sub-structure 72 extending in the first direction X, located between and connected to the two first sub-structures 71. As shown in FIG. 4, the first area Q11 in the display area Q1 includes a non-functional area Q112 and a functional area Q111 surrounding the non-functional area Q112. The coil portion 70 is arranged in the functional area Q111. For example, the shape of the functional area Q111 is adapted to the shape of the coil portion 70, that is, the coil portion 70 is in a "U" shape, and the functional area Q111 is also in a "U" shape. In this case, the non-functional area Q112 has a rectangular shape. Further, the display substrate includes not only the above structure, but also a plurality of fifth conductive wires 80 and a plurality of sixth conductive wires 90 crossing each other and arranged on the base substrate 10 in the non-functional area Q112. The fifth conductive wire 80 is a part of the first conductive structure 700, and the sixth conductive wire 90 is a part of the second conductive structure 800.

Figure 17:
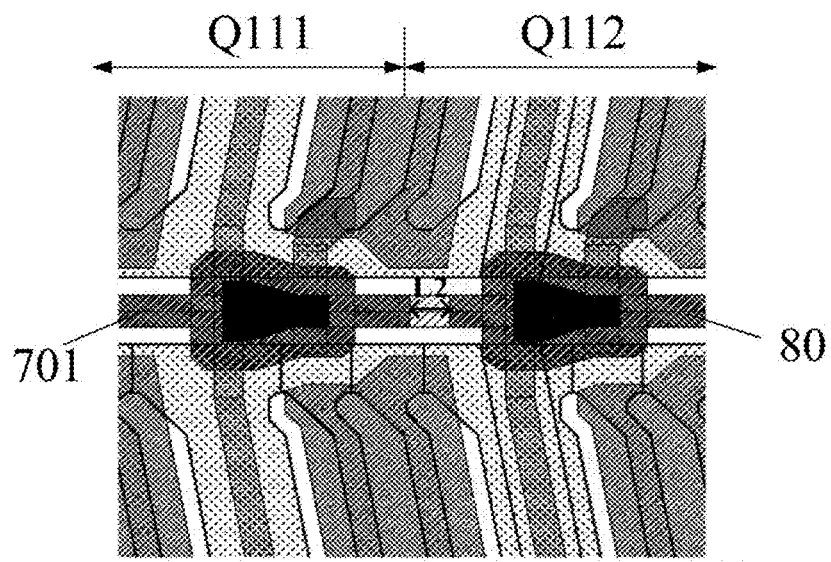
FIG. 17 is a schematic diagram of a part of a layout of a display substrate according to an embodiment of the present disclosure.

FIG. 17 is a schematic diagram of a part of a layout of a display substrate according to an embodiment of the present disclosure. In one example, as shown in FIGS. 4 and 17, in the plurality of first conductive structures 700 extending through the first area Q11, the first conductive structures 700 extending through both the functional area Q111 and the non-functional area Q112 each include a first conductive wire 701 and a fifth conductive wire 80. A distance L2 between the fifth conductive wire 80 and the first conductive wire 701 is not less than 2 μm to 6 μm; for example, the distance L2 between the fifth conductive wire 80 and the first conductive wire 701 is 4 μm. That is, the first conductive wire 701 and the fifth conductive wire 80 in one first conductive structure 700 are disconnected from each other, and a certain distance exists between the first conductive wire 701 and the fifth conductive wire 80, so that the influence on the performance of the display substrate due to the coupling of the signal of the near field communication antenna to the fifth conductive wire 80 may be effectively avoided by setting the certain distance. Similarly, in the plurality of second conductive wires 702 extending through the first area Q11, the second conductive structures 800 extending through both the functional area Q111 and the non-functional area Q112 each include the second conductive wire 702 and the sixth conductive wire 90. A distance between the sixth conductive wire 90 and the second conductive wire 702 is not less than 2 μm to 6 μm; for example, the distance between the sixth conductive wire 90 and the second conductive wire 702 is 4 μm. That is, the second conductive wire 702 and the sixth conductive wire 90 in one second conductive structure 800 are disconnected from each other, and a certain distance exists between the second conductive wire 702 and the sixth conductive wire 90, so that the influence on the performance of the display substrate due to the coupling of the signal of the near field communication antenna to the sixth conductive wire 90 may be effectively avoided by setting the certain distance.

Figure 18:
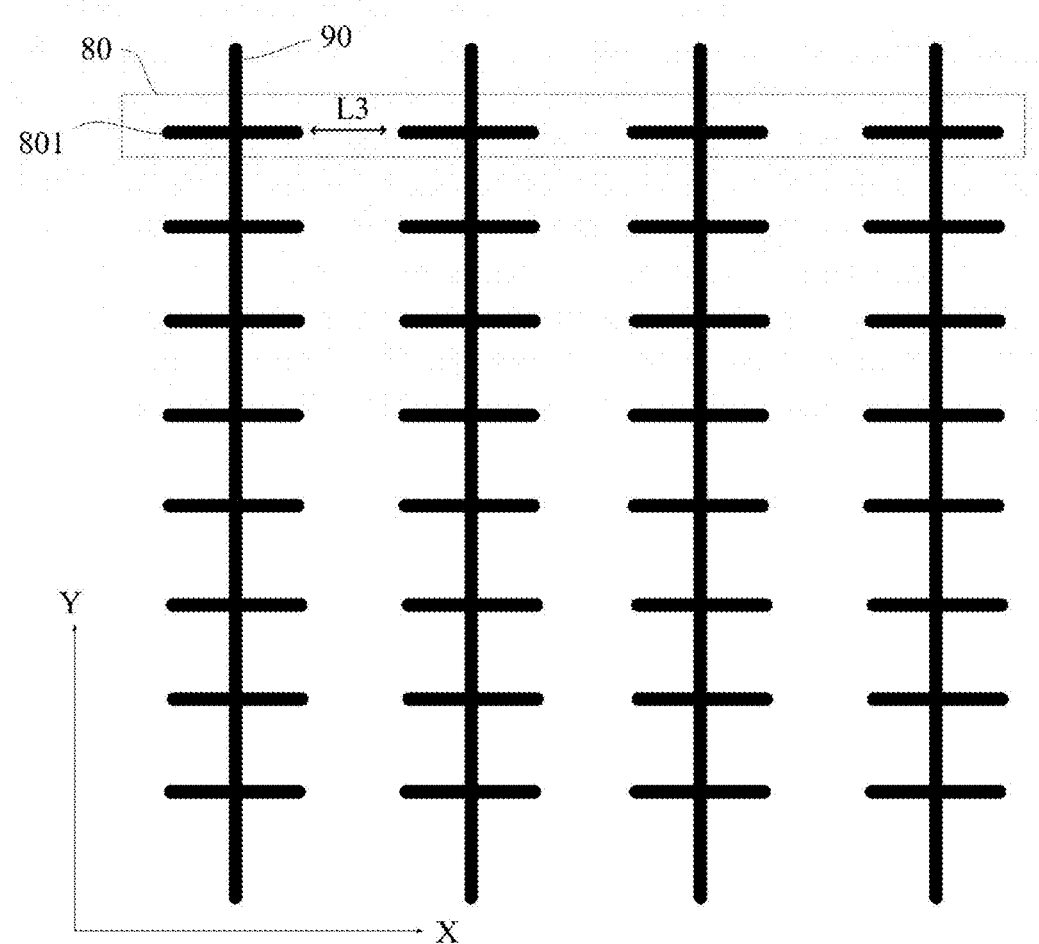
FIG. 18 is a schematic diagram of a wiring in a non-functional area of a display substrate according to an embodiment of the present disclosure.

FIG. 18 is a schematic diagram of a wiring in a non-functional area of a display substrate according to an embodiment of the present disclosure. Further, as shown in FIG. 18, in order to prevent the signal of the near field communication antenna from being coupled into the non-functional area Q112 as much as possible, in an embodiment of the present disclosure, the fifth conductive wire 80 is designed to be broken. For example, as shown in FIG. 18, the fifth conductive wire 80 includes a plurality of first conductive sub-wires 801 arranged side by side and at intervals in the first direction X. A gap between the adjacent first conductive sub-wires 801 is located between the adjacent sub-pixels. A width L3 of the gap between the adjacent first conductive sub-wires 801 is in a range of 2 μm to 6 μm; for example, the width L3 is 4 μm.

Where the signal lead-in line 400 is arranged in the peripheral area Q2 of the display substrate, and the fifth conductive wire 80 and the sixth conductive wire 90 are arranged in the non-functional area Q112, the sixth conductive wire 90 may be electrically connected to the signal lead-in line 400. For example, when the coil portion is not in operation, the signal written to the first and second conductive wires is a ground signal, in this case, the signal lead-in line 400 is a ground signal line. The signal lead-in line 400 may be arranged in a same layer as the gate line, and the fourth conductive wire 120 and the signal lead-in line 400 prevent the fifth conductive wire 80 and the sixth conductive wire 90 from being in a floating state. Specifically, if the display substrate is the display substrate shown in FIG. 6 or 10, the sixth conductive wire 90 may be electrically connected to the signal lead-in line through a via penetrating through the second interlayer insulating layer 170. If the display substrate is the display substrate shown in FIG. 11 or 14, the sixth conductive wire 90 may be electrically connected to the signal lead-in line through a via penetrating through the first interlayer insulating layer 50 and the second interlayer insulating layer 170.

Alternatively, the signal lead-in line 400 may include a first signal lead-in sub-line extending in the first direction X and a second signal lead-in sub-line extending in the second direction Y. The first signal lead-in sub-line may be arranged in a same layer and made of a same material as the gate line GL, and the second signal lead-in sub-line may be arranged in a same layer and made of a same material as the data line DL. In this case, the first and second signal lead-in sub-lines are electrically connected to each other through a via penetrating through the first interlayer insulating layer 50. The sixth conductive wire 90 is electrically connected to the first signal lead-in sub-line. Specifically, if the display substrate is the display substrate shown in FIG. 6 or 10, the sixth conductive wire 90 may be electrically connected to the first signal lead-in sub-line through a via penetrating through the second interlayer insulating layer 170. If the display substrate is the display substrate shown in FIG. 11 or 14, the sixth conductive wire 90 may be electrically connected to the first signal lead-in sub-line through a via penetrating through the first interlayer insulating layer 50 and the second interlayer insulating layer 170.

Figure 19:
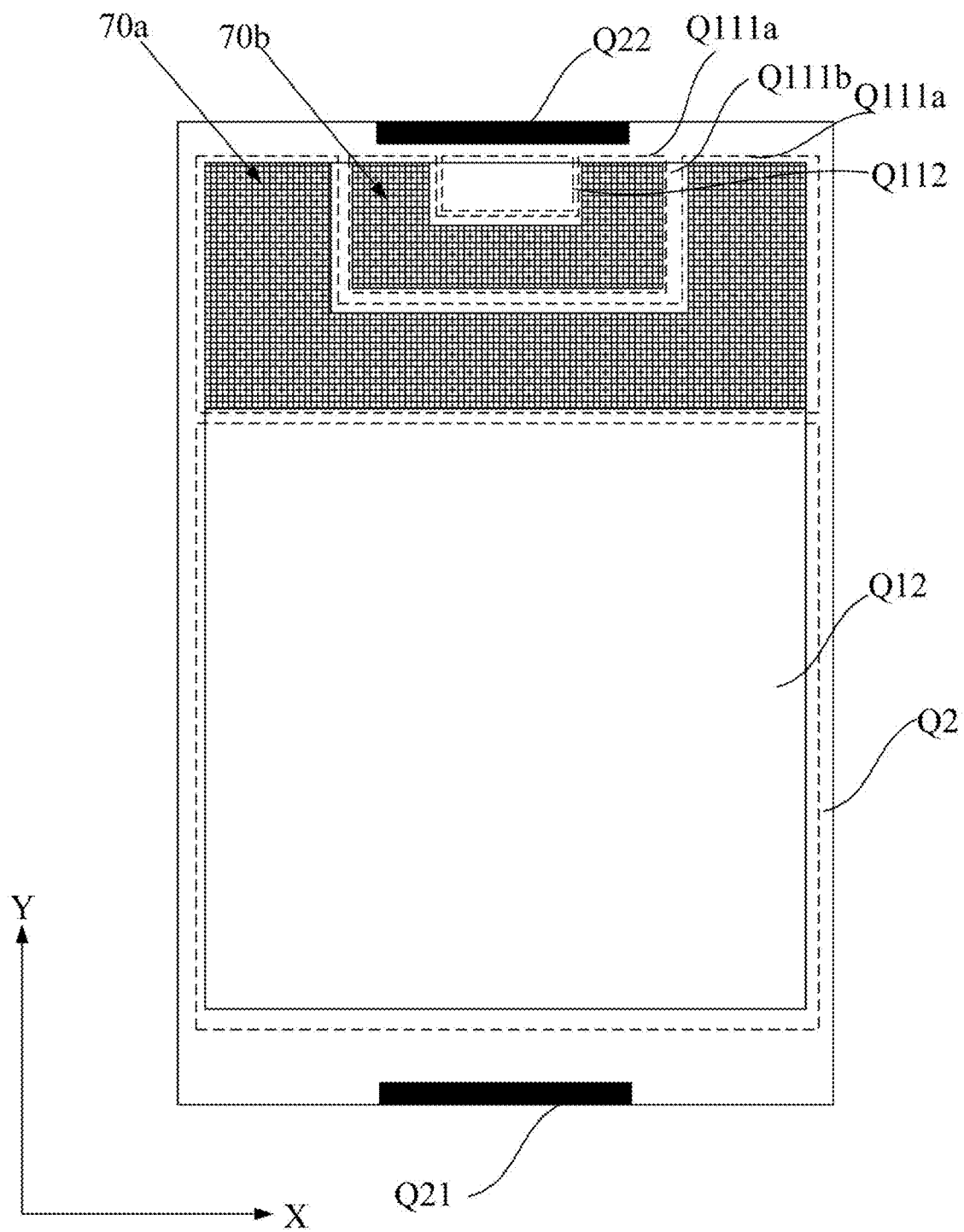
FIG. 19 is a schematic diagram of another display substrate according to an embodiment of the present disclosure.
Figure 20:
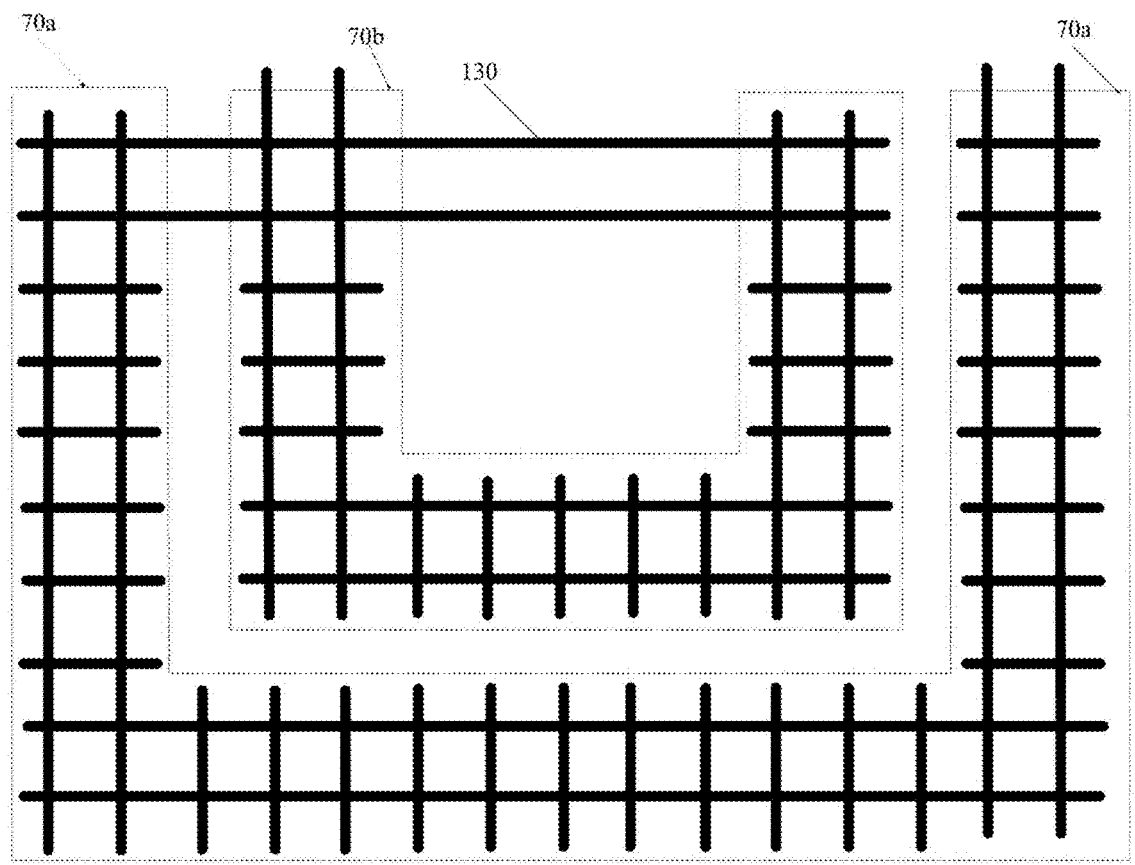
FIG. 20 is a schematic diagram of a near field communication antenna in the display substrate shown in FIG. 19.
Figure 21:
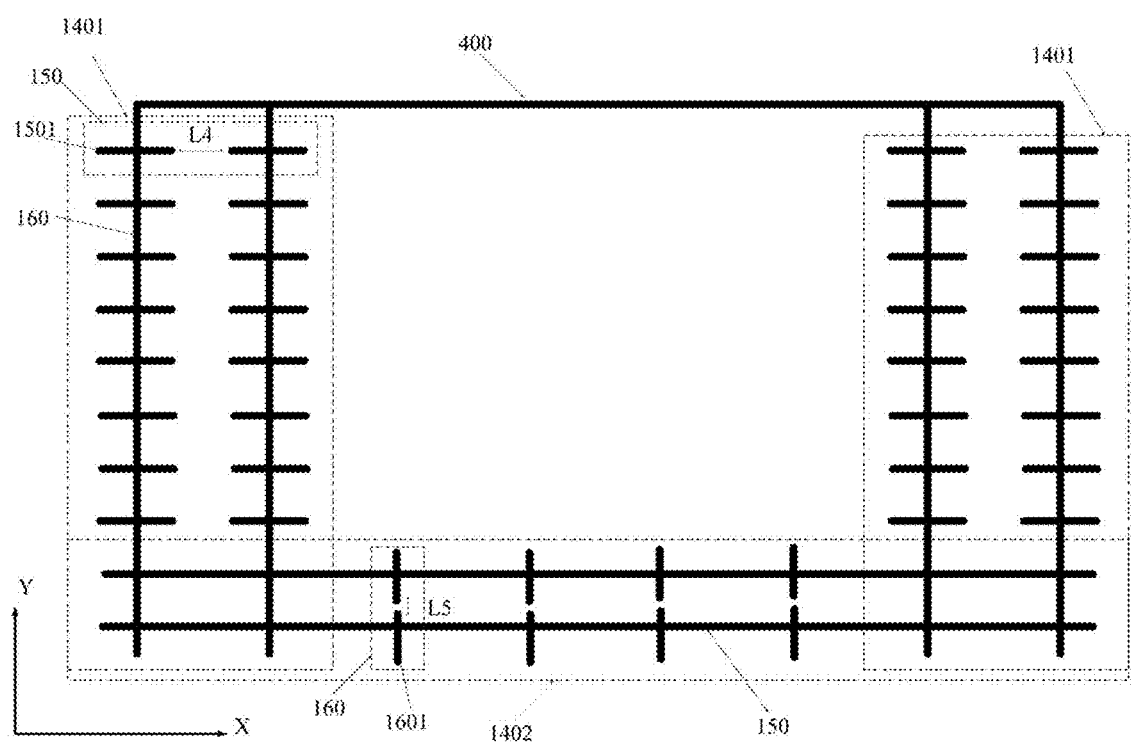
FIG. 21 is a schematic diagram of a wiring in a redundant functional area of the display substrate shown in FIG. 19.

In the above, the near field communication antenna includes only one coil portion 70. In some examples, the near field communication antenna may include a plurality of coil portions 70, and each of the plurality of coil portions 70 is nested in another coil portion 70 surrounding this coil portion. FIG. 19 is a schematic diagram of another display substrate according to an embodiment of the present disclosure; FIG. 20 is a schematic diagram of a near field communication antenna in the display substrate shown in FIG. 19; FIG. 21 is a schematic diagram of a wiring in a redundant functional area of the display substrate shown in FIG. 19. As shown in FIGS. 19 to 21, the functional area Q11 in the first area Q11 is divided into a first sub-functional area Q111a and a redundant functional area Q111b for convenience of description, wherein in each first sub-functional area Q111a is arranged one coil portion 70 of the near field communication antenna, and an area between two adjacent first sub-functional areas Q111a is the redundant functional area Q111b. The structure of the coil portion 70 in the first sub-functional area Q111a is the same as that described above, that is, the coil portion 70 includes the first conductive wire 701 and the second conductive wire 702 arranged crosswise. In an embodiment of the present disclosure, a plurality of seventh conductive wires 150 and a plurality of eighth conductive wires 160, which are arranged crosswise, are arranged in the redundant functional area Q111b. The seventh conductive wire 150 is a part of the first conductive structure 700, and the eighth conductive wire 160 is a part of the second conductive structure 800. By this arrangement, a uniformity of the wiring in the display substrate may be ensured, so that the pixel aperture ratio of the display substrate is uniform.

Further, the first conductive wire 701 and the seventh conductive wire 150 in a same first conductive structure 700 should be designed to be disconnected from each other, and a minimum distance between the first conductive wire 701 and the nearest seventh conductive wire 150 in the same first conductive structure 700 should be designed such that no coupling is generated between the seventh conductive wire 150 and the signal in the first conductive wire 701. Similarly, the second conductive wire 702 and the eighth conductive wire 160 in a same second conductive structure 800 should be designed to be disconnected from each other, and a minimum distance between the second conductive wire 702 and the nearest eighth conductive wire 160 in the same second conductive structure 800 should be designed such that no coupling is generated between the eighth conductive wire 160 and the signal in the second conductive wire 702. In some examples, the distance between the first conductive wire 701 and the nearest seventh conductive wire 150 in the same first conductive structure 700 is in a range of 2 μm to 6 μm, for example, the distance between the first conductive wire 701 and the nearest seventh conductive wire 150 in the same first conductive structure 700 is about 4 μm. The distance between the eighth conductive wire 160 and the nearest second conductive wire 702 in the same second conductive structure 800 is in a range of 2 μm to 6 μm, for example, the distance between the eighth conductive wire 160 and the nearest second conductive wire 702 in the same second conductive structure 800 is about 4 μm.

In some examples, where the coil portion 70 adopts a structure in a "U" shape, the shape of the first sub-functional area Q111a is adapted to the shape of the coil portion 70, so that the shape of the first sub-functional area Q111a is also in a "U" shape, and the redundant functional area Q111b is located between two adjacent first sub-functional areas Q111a. That is, the redundant functional area Q111b is defined by the adjacent first sub-functional areas Q111a, so that the shape of the redundant functional area Q111b is also in a "U" shape. Meanwhile, a redundant coil portion adopts a structure in a "U" shape. Specifically, the redundant coil portion includes two first redundant sub-structures 1401 arranged side by side in a first direction X and extending in a second direction Y, and one second redundant sub-structure 1402 extending in the first direction X, located between and connected to the two first redundant sub-structures 1401. Each of the two first redundant sub-structures 1401 and the second redundant sub-structure 1402 includes a seventh conductive wire 150 and an eighth conductive wire 160. The eighth conductive wire 160 of the first redundant sub-structure 1401 and the seventh conductive wire 150 of the second redundant sub-structure 1402 intersect with each other, and are electrically connected to each other through a via penetrating through the interlayer insulating layer 50. Further, in order to avoid the coupling between signals of the coil portion 70 and the redundant coil portion as much as possible, it is preferable that the seventh conductive wire 150 in the first redundant sub-structure 1401 is designed to be broken and the eighth conductive wire 160 in the second redundant sub-structure 1402 is designed to be broken, so as to avoid a normal operation of the display substrate from being affected due to a coupling of the first conductive wire 701 and the seventh conductive wire 150 in the same first conductive structure 700 and a coupling of the second conductive wire 702 and the eighth conductive wire 160 in the same second conductive structure 800.

Specifically, in an embodiment of the present disclosure, the seventh conductive wire 150 in the first redundant sub-structure 1401 includes a plurality of second conductive sub-wires 1501 arranged side by side in the first direction X. A gap between two adjacent second conductive sub-wires 1501 is located between two adjacent sub-pixels. Similarly, the eighth conductive wire 160 in the second redundant sub-structure 1402 includes a plurality of third conductive sub-wires 1601 arranged side by side in the second direction Y. A gap between two adjacent third conductive sub-wires 1601 is located between two adjacent sub-pixels.

In some examples, in the above case, for any of the seventh conductive wires 150 in the first redundant sub-structure 1401, a width L4 of the gap between the two adjacent second conductive sub-wires 1501 is in a range of 2 μm to 6 μm, for example, the width L4 of the gap between the two adjacent second conductive sub-wires 1501 is about 4 μm. For any of the eighth conductive wires 160 in the second redundant sub-structure 1402, a width L5 of the gap between the two adjacent third conductive sub-wires 1601 is in a range of 2 μm to 6 μm, for example, the width L5 of the gap between the two adjacent third conductive sub-wires 1601 is about 4 μm. The coupling between two adjacent coil portions 70 in the near field communication antenna may be effectively avoided by reasonably setting the gap between the second conductive sub-wires 1501 in the seventh conductive wire 150 in the first redundant sub-structure 1401 and the gap between the third conductive sub-wires 1601 in the eighth conductive wire 160 in the second redundant sub-structure 1402.

In some examples, where the signal lead-in line 400 described above is arranged in the peripheral area Q2 of the display substrate, the eighth conductive wire 160 of the first redundant sub-structure 1401 and the seventh conductive wire 150 of the second redundant sub-structure 1402 are both electrically connected to the signal lead-in line 400. For example, when the coil portion is not in operation, the signal written to the first conductive wire and the second conductive wire is a ground signal, in this case, the signal lead-in line 400 is a ground signal line. The signal lead-in line 400 may be arranged in a same layer as the gate line, and the eighth conductive wire 160 in the first redundant sub-structure 1401 and the seventh conductive wire 150 in the second redundant sub-structure 1402 are both electrically connected to the signal lead-in line 400, so as to prevent the seventh conductive wire 150 and the eighth conductive wire 160 from being in a floating state. Specifically, if the display substrate is the display substrate shown in FIG. 6 or 10, the eighth conductive wire 160 in the first redundant sub-structure 1401 and the seventh conductive wire 150 in the second redundant sub-structure 1402 may be electrically connected to the signal lead-in line through a via penetrating through the second interlayer insulating layer 170. If the display substrate is the display substrate shown in FIG. 11 or 14, the eighth conductive wire 160 in the first redundant sub-structure 1401 and the seventh conductive wire 150 in the second redundant sub-structure 1402 may be electrically connected to the signal lead-in line through a via penetrating through the first interlayer insulating layer 50 and the second interlayer insulating layer 170.

Alternatively, the signal lead-in line 400 may include a first signal lead-in sub-line extending in the first direction X and a second signal lead-in sub-line extending in the second direction Y. The first signal lead-in sub-line may be arranged in a same layer and made of a same material as the gate line GL, and the second signal lead-in sub-line may be arranged in a same layer and made of a same material as the data line DL. In this case, the first and second signal lead-in sub-lines are electrically connected to each other through a via penetrating through the first interlayer insulating layer 50. The seventh conductive wire 150 in the second redundant sub-structure 1402 is electrically connected to the second signal lead-in sub-line, and the eighth conductive wire 160 in the first redundant sub-structure 1401 is electrically connected to the first signal lead-in sub-line. Specifically, if the display substrate is the display substrate shown in FIG. 6 or 10, the eighth conductive wire 160 in the first redundant sub-structure 1401 may be electrically connected to the first signal lead-in sub-line through a via penetrating through the second interlayer insulating layer 170, and the seventh conductive wire 150 in the second redundant sub-structure 1402 may be electrically connected to the second signal lead-in sub-line through a via penetrating through the first interlayer insulating layer 50 and the second interlayer insulating layer 170. If the display substrate is the display substrate shown in FIG. 11 or 14, the eighth conductive wire 160 in the first redundant sub-structure 1401 may be electrically connected to the first signal lead-in sub-line through a via penetrating through the first interlayer insulating layer 50 and the second interlayer insulating layer 170, and the seventh conductive wire 150 in the second redundant sub-structure 1402 may be electrically connected to the second signal lead-in sub-line through a via penetrating through the second interlayer insulating layer 170.

In some examples, where the near field communication antenna includes a plurality of coil portions 70, the near field communication antenna further includes a connecting jumper 130 arranged on the base substrate 10, and the connecting jumper 130 is connected to the coil portions 70 to constitute a spiral coil.

In order to make the connection relationship between the coil portions 70 and the connecting jumper 130 in the near field communication antenna be more clearly understood, as an example, the near field communication antenna including two coil portions 70 is described in an embodiment of the present disclosure, and the two coil portions 70 in the near field communication antenna are referred to as a first coil portion 70a and a second coil portion 70b, respectively. As shown in FIG. 20, the second coil portion 70b is nested in the first coil portion 70a, the first and second coil portions 70a and 70b each include a first end and a second end, and both ends of the connecting jumper 130 are connected to the first end of the first coil portion 70a and the second end of the second coil portion 70b, respectively. The second end of the first coil portion 70a serves as a first end of the near field communication antenna, and the first end of the second coil portion 70b serves as a second end of the near field communication antenna. In this case, the first end and the second end of the near field communication antenna may also be electrically connected to the first connecting electrode and the second connecting electrode in the above described manner, so as to achieve the bonding between the near field communication antenna and the driving chip.

Further, the connecting jumper 130 in the near field communication antenna may be arranged in the peripheral area Q2, and may be arranged in a same layer and made of a same material as the first conductive structure 700. in this case, the second conductive wire 702 at the first end of the first coil portion 70*a* may be electrically connected to the connecting jumper 130 through a via penetrating through the interlayer insulating layer 50; the second conductive wire 702 at the second end of the second coil portion 70*b* may be electrically connected to the connecting jumper 130 through a via penetrating through the interlayer insulating layer 50. In some examples, the connecting jumper 130 may be a part of the first conductive structure 700. In this case, the connecting jumper 130 extends in the first direction X. Alternatively, in an embodiment of the present disclosure, the connecting jumper 130 may alternatively be arranged outside the peripheral area Q2.

In some examples, the display substrate may further include a flexible circuit board. Where the near field communication antenna includes a plurality of coil portions 70, the connecting jumper 130 of the near field communication antenna may alternatively be arranged on the flexible circuit board. Alternatively, the driving chip may be arranged on the flexible circuit board, and in this case, the first end and the second end of the near field communication antenna may alternatively be electrically connected to the flexible circuit board through the first connecting electrode and the second connecting electrode, respectively, so as to electrically connect the near field communication antenna to the driving chip.

In order to make the structure of the display substrate more clear, three structural examples of the display substrate are specifically given as follows. It should be noted that the following three examples do not constitute a limitation to the protection scope of the embodiment of the present disclosure.

As a first example, as shown in FIG. 3, the display area Q1 in the display substrate includes a first area Q11 and a first second area Q12, and the first area Q11 is located on a side of the second area Q12 close to the second pad area Q22. A near field communication antenna having one coil portion 70 is arranged in the first area Q11. The first area Q11 includes a non-functional area Q112 and a functional area Q111 surrounding the non-functional area Q112, and the coil portion 70 is arranged in the functional area Q111. The specific structure of the coil portion 70 is as described above, and therefore will not be repeated herein. The fifth conductive wires 80 and the sixth conductive wires 90, which are arranged crosswise as described above, are arranged in the non-functional area Q112; third conductive wires 110 and fourth conductive wires 120, which are arranged crosswise as described above, are arranged in second area Q12. The third conductive wires 110, the fourth conductive wires 120, the fifth conductive wires 80, and the sixth conductive wires 90 are all described in detail in the above, and therefore a description thereof will not be repeated herein.

As a second example, as shown in FIG. 19, the display area Q1 in the display substrate includes a first area Q11 and a first second area Q12, and the first area Q11 is located on a side of the second area Q12 close to the second pad area Q22. A near field communication antenna having two coil portions 70 is arranged in the first area Q11. The two coil portions 70 are referred to as a first coil portion 70*a* and a second coil portion 70*b*, respectively. The first area Q11 includes a non-functional area Q112 and a functional area Q111 surrounding the non-functional area Q112; the functional area Q111 includes two first functional sub-areas Q111*a* and a redundant functional area Q111*b* located between the two first functional sub-areas Q111*a*; the first coil portion 70*a* and the second coil portion 70*b* are arranged in two first sub-functional areas Q111*a*, respectively. The specific structures of the first coil portion 70*a* and the second coil portion 70*b* are as described above, and therefore the description thereof will not be repeated herein. The seventh conductive wires 150 and the eighth conductive wires 160 described above are arranged in the redundant functional area Q111*b*; the fifth conductive wires 80 and the sixth conductive wires 90, which are arranged crosswise as described above, are arranged in the non-functional area Q112; the third conductive wires 110 and fourth conductive wires 120, which are arranged crosswise as described above, are arranged in the second area Q12. The third conductive wires 110, the fourth conductive wires 120, the fifth conductive wires 80, the sixth conductive wires 90, the seventh conductive wires 150 and the eighth conductive wires 160 are described in detail in the above, and therefore a description thereof will not be repeated here.

Figure 22:
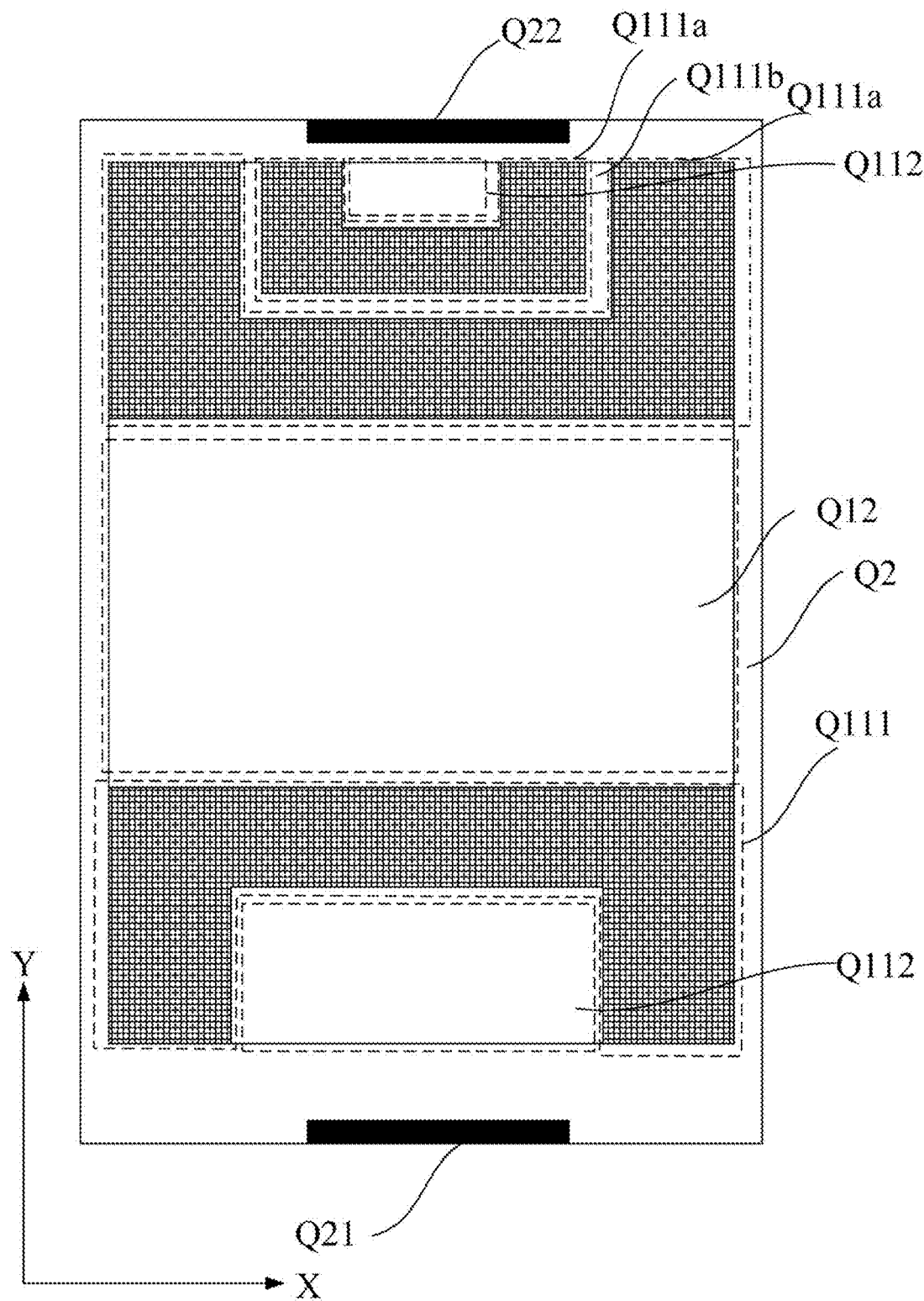
FIG. 22 is a schematic diagram of another display substrate according to an embodiment of the present disclosure.

FIG. 22 is a schematic diagram of another display substrate according to an embodiment of the present disclosure. As a third example, as shown in FIG. 22, the display area Q1 in the display substrate includes two first areas Q11 and a first second area Q12, and one of the two first areas Q11 is located on a side of the second area Q12 close to the first pad area Q21, and the other of the two first areas Q11 is located on a side of the second area Q12 close to the second pad area Q22. The structure of one of the first areas Q11 is the same as that shown in FIG. 3, that is, the structure of one of the first areas Q11 is the same as the near field communication antenna having two coil portions 70, and therefore the description thereof is no repeated herein; the structure of the other first area Q11 is the same as that in FIG. 18, that is, the structure of the other first area Q11 is the same as the near field communication antenna having one coil portion 70, and therefore, the description thereof is omitted. The third conductive wires 110 and fourth conductive wires 120, which are arranged crosswise as described above, are arranged in second area Q12. The third conductive wires 110 and the fourth conductive wires 120 are described in detail in the above, and therefore a description thereof will not be repeated herein.

In a second aspect, an embodiment of the present disclosure provides a display apparatus, which includes the display substrate and an opposing substrate which is opposite to the display substrate. The opposite substrate is provided with a black matrix, and orthographic projections of the gate line GL, the data line DL, the first conductive structure 700 and the second conductive structure 800 on the base substrate 10 are all within an orthographic projection of the black matrix on the base substrate. Alternatively, the display apparatus further has a control circuit, which is connected to the near field communication antenna.

The display apparatus may be a product or component having a display function and a communication function, such as a liquid crystal panel, an OLED panel, a mobile phone, a tablet computer, a digital photo frame, a navigator, or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the protection scope of the present disclosure.

What is claimed is:

1. A display substrate, comprising a display area and a peripheral area surrounding the display area; wherein the display area comprises a functional area and a non-functional area; the display substrate comprises:
   a base substrate;
   a plurality of first signal lines, which are on the base substrate and in the display area and the peripheral area, extend in a first direction and are arranged side by side in a second direction;
   a first interlayer insulating layer, which is on a side of the plurality of first signal lines away from the base substrate;
   a plurality of second signal lines, which are on a side of the first interlayer insulating layer away from the base substrate and in the display area and the peripheral area, extend in the second direction and are arranged side by side in the first direction;
   a conductive mesh, which is on the base substrate; wherein the conductive mesh comprises a plurality of first conductive structures and a plurality of second conductive structures, each of the plurality of first conductive structures intersects with and is electrically connected to plurality of second conductive structures, and each of the plurality of second conductive structures intersects with and is electrically connected to plurality of first conductive structures; the plurality of first conductive structures and the plurality of second conductive structures are in the display area and the peripheral area; an orthographic projection of each of the plurality of first conductive structures on the base substrate at least partially overlaps an orthographic projection of one of the plurality of first signal lines on the base substrate; an orthographic projection of each of the plurality of second conductive structures on the base substrate at least partially overlaps an orthographic projection of one of the plurality of second signal lines on the base substrate; and
   an auxiliary functional structure, which is on the base substrate and in at least the display area; wherein the auxiliary functional structure comprises a plurality of first conductive wires and a plurality of second conductive wires which are arranged crosswise; each of the plurality of first conductive wires is at least a part of one of the plurality of first conductive structures, and each of at least a portion of the plurality of first conductive structures comprises two of the plurality of first conductive wires; and each of the plurality of second conductive wires is at least a part of one of the plurality of second conductive structures,
   wherein the display substrate further comprises a plurality of sub-pixels; the sub-pixels arranged side by side in the first direction form a first pixel group, and the sub-pixels arranged side by side in the second direction form a second pixel group;
   each of the plurality of first conductive structures is between two adjacent first pixel groups; and each of the plurality of second conductive structures is between two adjacent second pixel groups,
   wherein each of the plurality of first signal lines is a gate line, each of the plurality of second signal lines is a data line; the sub-pixels in a same first pixel group are controlled by a same gate line, and the sub-pixels in a same second pixel group are written with data voltage signals by a same data line,
   wherein each of the plurality of sub-pixels comprises a thin film transistor, a pixel electrode and a common electrode; gate electrodes of the thin film transistors in the same first pixel group are connected to the same gate line; source electrodes of the thin film transistors in the same second pixel group are connected to the same data line; a drain electrode of the thin film transistor in any sub-pixel is directly connected to the pixel electrode;
   the conductive mesh is on a side of the thin film transistor close to the base substrate, and a second interlayer insulating layer is between the conductive mesh and a layer where the gate electrode of the thin film transistor is located; and
   a third interlayer insulating layer is on a side of a layer, where the pixel electrode is located, away from the base substrate, and the common electrode is on a side of the third interlayer insulating layer away from the base substrate,
   wherein any one of the plurality of first conductive structures has a plurality of first openings, and an orthographic projection of each of the plurality of the first openings on the base substrate covers an orthographic projection of an active layer of the thin film transistor of one of the plurality of sub-pixels on the base substrate.

2. The display substrate according to claim 1, wherein the display substrate further comprises a plurality of sub-pixels; the sub-pixels arranged side by side in the first direction form a first pixel group, and the sub-pixels arranged side by side in the second direction form a second pixel group; the sub-pixels in a same second pixel group have a same color, and every N number of sub-pixels arranged side by side in the first direction form a pixel unit, where N≥2, and N is an integer; the pixel units arranged side by side in the second direction form a pixel unit group; and
   every two adjacent first pixel groups is provided with one of the plurality of first conductive structures therebetween; and in each pixel unit group is arranged one of the plurality of second conductive structures.

3. The display substrate according to claim 2, wherein the N number of sub-pixels in the pixel unit comprise a red sub-pixel, a green sub-pixel and a blue sub-pixel; and each of the plurality of second conductive structures is between the red sub-pixel and the green sub-pixel.

4. The display substrate according to claim 3, wherein each of the plurality of first signal lines is a gate line, and each of the plurality of second signal lines is a touch signal line.

5. The display substrate according to claim 4, wherein the display substrate further comprises a plurality of data lines; the sub-pixels in a same first pixel group are controlled by a same gate line, and the sub-pixels in a same second pixel group are written with data voltage signals by a same data line.

6. The display substrate according to claim 1, wherein the auxiliary functional structure has a first end and a second end; the second conductive wires in the first end and the second end of the auxiliary functional structure extend into the peripheral area; the display substrate further comprises a first shorting bar, a second shorting bar, a first transfer electrode, a second transfer electrode, a first connecting electrode and a second connecting electrode which are in the peripheral area;

the first shorting bar and the second shorting bar are in a same layer as the auxiliary functional structure; the first shorting bar is configured to short the second conductive wires in the first end of the auxiliary functional structure; and the second shorting bar is configured to short the second conductive wires in the second end of the auxiliary functional structure;

the first transfer electrode and the second transfer electrode are in a same layer as the gate line, the first transfer electrode is electrically connected to the first shorting bar through a via penetrating through the second interlayer insulating layer, and the second transfer electrode is electrically connected to the second shorting bar through a via penetrating through the second interlayer insulating layer; and the first connecting electrode and the second connecting electrode are in a same layer as the common electrode, the first connecting electrode is electrically connected to the first transfer electrode through a via penetrating through the first interlayer insulating layer and the third interlayer insulating layer, and the second connecting electrode is electrically connected to the second transfer electrode through a via penetrating through the first interlayer insulating layer and the third interlayer insulating layer.

7. The display substrate according to claim 5, wherein each of the plurality of sub-pixels comprises a thin film transistor, a pixel electrode, and a common electrode; gate electrodes of the thin film transistors in the same first pixel group are connected to the same gate line; source electrodes of the thin film transistors in the same second pixel group are connected to the same data line; a second interlayer insulating layer is on a layer where the source electrode and drain electrode of the thin film transistor are arranged; the drain electrode of the thin film transistor in any sub-pixel is electrically connected to the pixel electrode through a via penetrating through the second interlayer insulating layer;

the conductive mesh is on one side of the second interlayer insulating layer away from the base substrate; and a third interlayer insulating layer is on a side of a layer, where the pixel electrode is located, away from the base substrate, and the common electrode is on a side of the third interlayer insulating layer away from the base substrate.

8. The display substrate according to claim 7, wherein the auxiliary functional structure has a first end and a second end; the second conductive wires in the first end and the second end of the auxiliary functional structure extend into the peripheral area; the display substrate further comprises a first shorting bar, a second shorting bar, a first connecting electrode and a second connecting electrode which are in the peripheral area;

the first shorting bar and the second shorting bar are in a same layer as the auxiliary functional structure; the first shorting bar is configured to short the second conductive wires in the first end of the auxiliary functional structure; the second shorting bar is configured to short the second conductive wires in the second end of the auxiliary functional structure;

the first connecting electrode and the second connecting electrode are in a same layer as the common electrode, the first connecting electrode is electrically connected to the first shorting bar through a via penetrating through the third interlayer insulating layer, and the second connecting electrode is electrically connected to the second shorting bar through a via penetrating through the third interlayer insulating layer.

9. The display substrate according to claim 1, wherein the display area comprises at least one first area and at least one second area; the auxiliary functional structure is in one of the at least one first area;

the display substrate further comprises:

a plurality of third conductive wires and a plurality of fourth conductive wires, which are on the base substrate and in the second area and the peripheral area; wherein each of the plurality of third conductive wires intersects with the plurality of fourth conductive wires, each of the plurality of fourth conductive wires intersect with the plurality of third conductive wires, each of the plurality of third conductive wires is at least a part of one of the plurality of first conductive structures; each of the plurality of fourth conductive wires is a part of one of the plurality of second conductive structures; and a distance between the fourth conductive wire and the second conductive wire in one of the plurality of second conductive structures is in a range of 2 µm to 6 µm.

10. The display substrate according to claim 9, wherein the display substrate further comprises:

a signal lead-in line, which is on the base substrate and in the peripheral area; each of the plurality of third conductive wires is electrically connected to the signal lead-in line; and/or each of the plurality of fourth conductive wires is electrically connected to the signal lead-in line.

11. The display substrate according to claim 1, wherein the auxiliary functional structure comprises at least one coil portion; each of the at least one coil portion at least comprises two sub-structures having different extending directions; each of the two sub-structures comprises a portion of the plurality of first conductive wires and a portion of the plurality of second conductive wires.

12. The display substrate according to claim 11, wherein each of the at least one coil portion comprises three sub-structures, which are two first sub-structures and one second sub-structure; the two first sub-structures extend in the second direction and are arranged side by side in the first direction, and the second sub-structure is between the two first sub-structures and connected to the two first sub-structures.

13. The display substrate according to claim 12, wherein the display area comprises at least one first area and at least one second area; the first area comprises a non-functional area and a functional area surrounding the non-functional area; the coil portion is in the functional area;

the display substrate further comprises a plurality of fifth conductive wires and a plurality of sixth conductive wires which are in the non-functional area, wherein each of the plurality of fifth conductive wires intersects with the plurality of sixth conductive wires, each of the plurality of sixth conductive wires intersect with the plurality of fifth conductive wires; the first conductive structure comprises the fifth conductive wire; the second conductive structure comprises the sixth conductive wire; a distance between the fifth conductive wire and the first conductive wire in a same first conductive structure is in a range of 2 µm to 6 µm; and/or a distance between the sixth conductive wire and the second conductive wire in a same second conductive structure is a range of 2 µm to 6 µm.

14. The display substrate according to claim 12, wherein the display area comprises at least one first area and at least one second area; the auxiliary functional structure is in one of the at least one first area; the first area comprises a non-functional area and a functional area surrounding the non-functional area; the functional area comprises: a plurality of functional sub-areas, wherein an inner functional sub-area of the plurality of functional sub-areas is nested in an outer functional sub-area of the plurality of functional sub-areas; and a redundant functional area which is between two adjacent sub-functional areas; in each of the plurality of functional sub-areas is arranged one of the at least one coil portion;

the display substrate further comprises a redundant coil portion arranged on the base substrate and in the redundant functional area; and the redundant coil portion comprises a plurality of seventh conductive wires and a plurality of eighth conductive wires, which are arranged crosswise and are in the redundant functional area; each of the plurality of seventh conductive wires is a part of one of the plurality of first conductive structures, and each of the plurality of eighth conductive wires is a part of one of the plurality of second conductive structures.

15. The display substrate according to claim 14, further comprising a connecting jumper on the base substrate, wherein the connecting jumper is connected to the coil portions to form a spiral coil.

16. A display apparatus, comprising the display substrate according to claim 1, wherein the display apparatus further comprises an opposing substrate which is opposite to the display substrate, a black matrix is on the opposing substrate, and an orthographic projection of the auxiliary functional structure on the base substrate is within an orthographic projection of the black matrix on the base substrate.

\* \* \* \* \*